(12) United States Patent
Takahashi et al.

(10) Patent No.: US 8,040,685 B2
(45) Date of Patent: Oct. 18, 2011

(54) STACKED WIRING BOARD AND METHOD OF MANUFACTURING STACKED WIRING BOARD

(75) Inventors: Michimasa Takahashi, Ogaki (JP); Masakazu Aoyama, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 623 days.

(21) Appl. No.: 12/146,032

(22) Filed: Jun. 25, 2008

(65) Prior Publication Data

US 2009/0020326 A1 Jan. 22, 2009

Related U.S. Application Data

(60) Provisional application No. 60/950,202, filed on Jul. 17, 2007.

(51) Int. Cl.
*H05K 1/11* (2006.01)

(52) U.S. Cl. ........ 361/792; 361/809; 361/790; 361/729; 361/735; 361/736; 174/261

(58) Field of Classification Search .................. 361/790, 361/792, 795, 809, 729, 735, 736, 742, 748, 361/749, 758; 174/262, 255, 256, 259, 250, 174/260, 261
See application file for complete search history.

(56) References Cited

U.S. PATENT DOCUMENTS

| | | | |
|---|---|---|---|
| 2003/0051903 A1* | 3/2003 | Roeters et al. | 174/255 |
| 2005/0168961 A1* | 8/2005 | Ono et al. | 361/784 |
| 2006/0237225 A1* | 10/2006 | Kariya et al. | 174/260 |
| 2007/0102191 A1* | 5/2007 | Asami et al. | 174/262 |
| 2007/0137887 A1* | 6/2007 | Watanabe et al. | 174/256 |
| 2009/0007425 A1* | 1/2009 | Shinada et al. | 29/843 |

FOREIGN PATENT DOCUMENTS

| | | |
|---|---|---|
| JP | 05-152693 | 6/1993 |
| JP | 2002-064271 A | 2/2002 |
| JP | 2004-266236 A | 9/2004 |
| JP | 2005-322871 A | 11/2005 |
| WO | WO 2005/029934 A1 | 3/2005 |

OTHER PUBLICATIONS

U.S. Appl. No. 12/050,646, filed Mar. 18, 2008, Takahashi, et al.
U.S. Appl. No. 12/050,771, filed Mar. 18, 2008, Takahashi, et al.
U.S. Appl. No. 12/144,691, filed Jun. 24, 2008, Takahashi, et al.
U.S. Appl. No. 12/146,279, filed Jun. 25, 2008, Takahashi, et al.

* cited by examiner

*Primary Examiner* — Hoa C Nguyen
(74) *Attorney, Agent, or Firm* — Oblon, Spivak, McClelland, Maier & Neustadt, L.L.P.

(57) ABSTRACT

A wiring board and method of forming the wiring board. The wiring board includes a first substrate, and a second substrate having a smaller mounting area than a mounting area of the first substrate. A base substrate is laminated between the first substrate and the second substrate such that the first substrate extends beyond an edge of the second substrate, and at least one via formed in at least one of the first substrate or the second substrate. A thickness of a portion of the base substrate that is sandwiched between the first substrate and the second substrate is greater than a thickness of a portion of the base substrate that is not sandwiched between the first substrate and the second substrate.

14 Claims, 20 Drawing Sheets

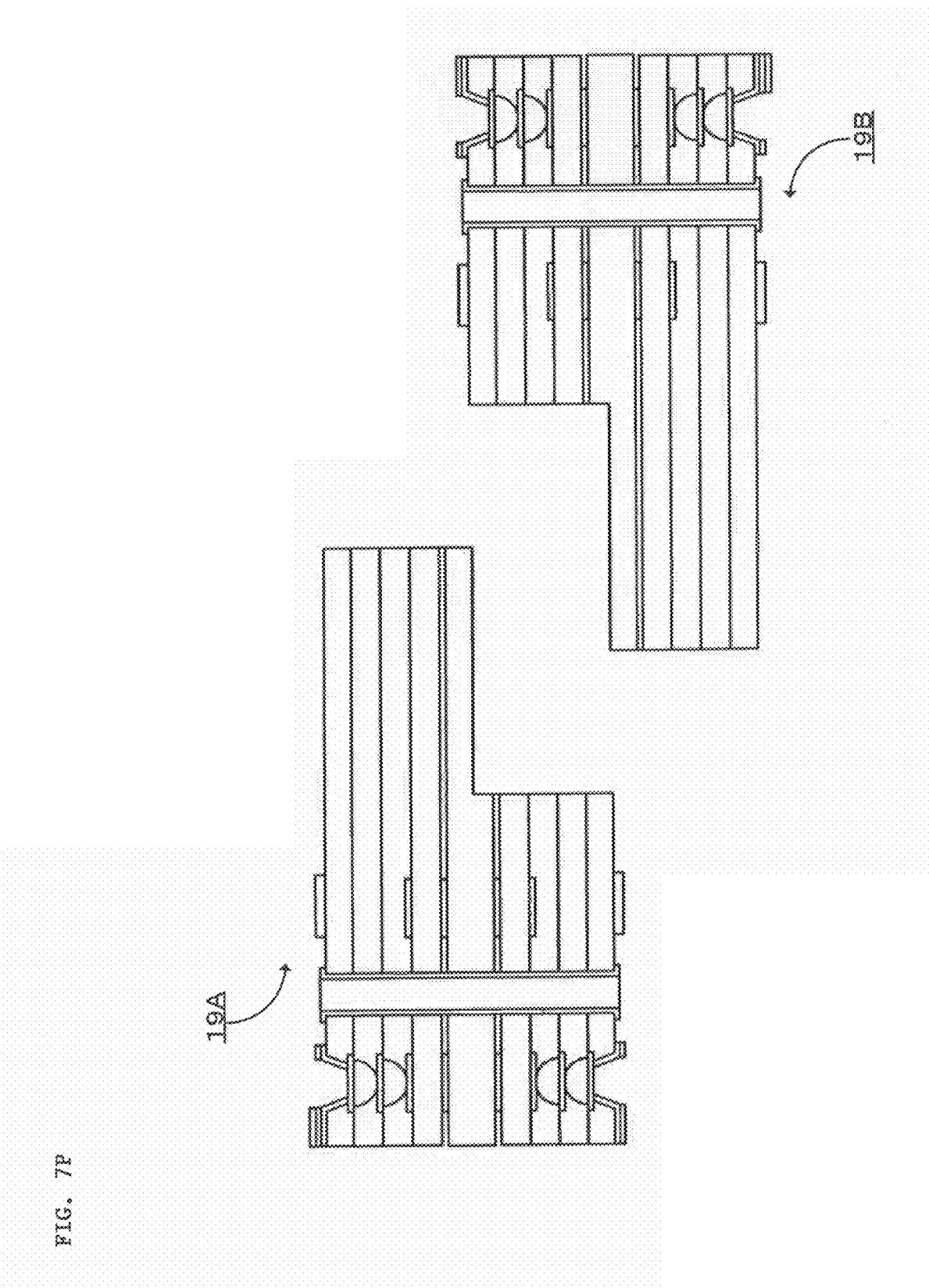

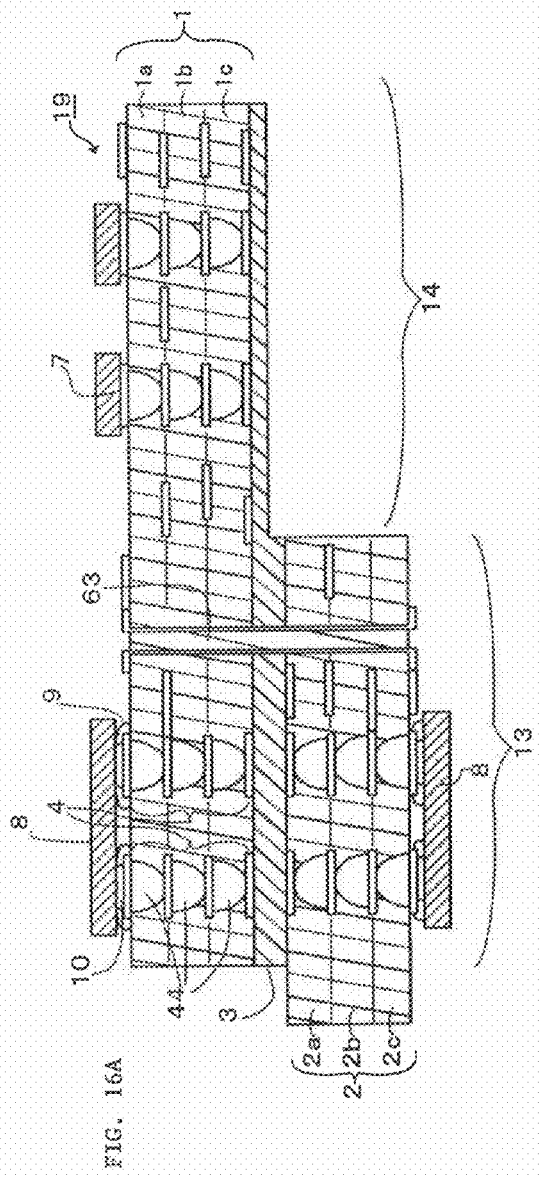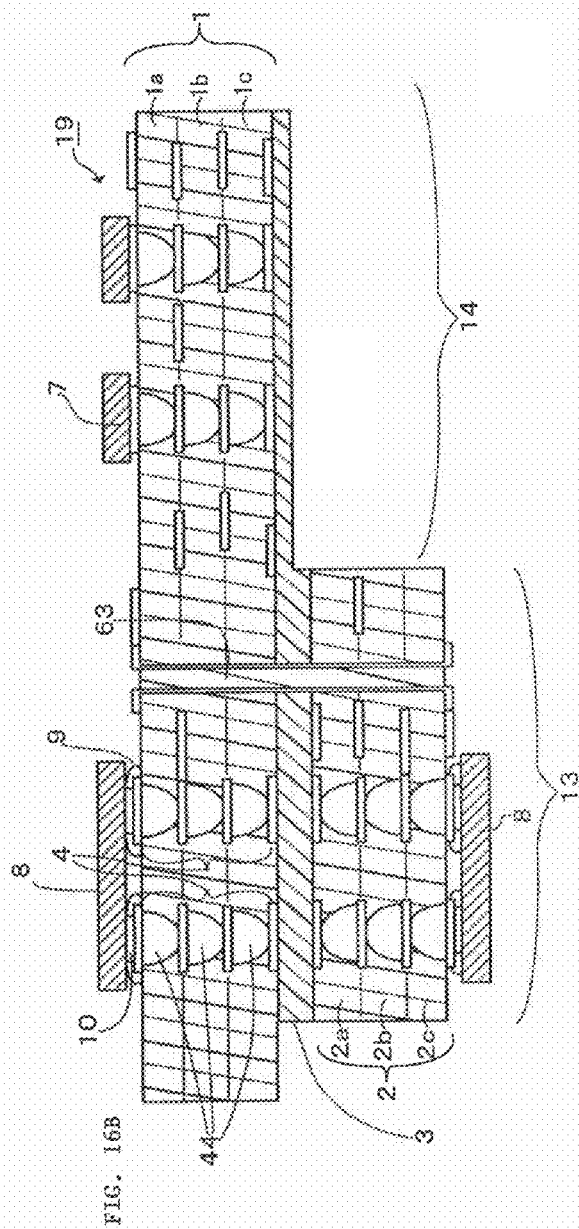

STACKED WIRING BOARD AND METHOD OF MANUFACTURING STACKED WIRING BOARD

RELATED APPLICATION

This application claims the benefit of U.S. Provisional Application Ser. No. 60/950,220 filed Jul. 17, 2007, the entire content of which is incorporated herein by reference.

TECHNICAL FIELD

The present invention relates to a wiring board formed by combining at least two substrates each having a different size mounting area, and a method of manufacturing such a wiring board.

DESCRIPTION OF RELATED ART

Japanese Laid-Open Patent Publication H5-152693 discloses technology to solve a problem of insufficient rigidity in a wiring board. The technology relates to a wiring board having a reinforced section formed by making an extended portion of a flexible substrate and folding the extended portion.

Further, technology to provide wiring structures with high flexibility is described, for example, in WO 05/029934. This publication discloses a printed wiring board having a first substrate and a second substrate laminated on the first substrate, where the outline of the second substrate is different from that of the first substrate. The entire content of each of H5-152693 and WO 05/029934 is incorporated herein by reference.

SUMMARY OF THE INVENTION

A first aspect of the invention includes a wiring board having a first substrate, and a second substrate having a smaller mounting area than a mounting area of the first substrate. A base substrate is laminated between the first substrate and the second substrate such that the first substrate extends beyond an edge of the second substrate, and at least one via formed in at least one of the first substrate or the second substrate. A thickness of a portion of the base substrate that is sandwiched between the first substrate and the second substrate is greater than a thickness of a portion of the base substrate that is not sandwiched between the first substrate and the second substrate.

Another aspect of the invention includes a method of manufacturing a wiring board, including forming a base substrate, and forming a first insulation layer on a first surface of the base substrate and a second insulation layer on a second surface of the base substrate opposing the first surface. Also included is forming a first insulation layer on a first surface of the base substrate and a second insulating layer on a second surface of the base substrate opposing the first surface, and forming at least one via in at least one of the first or second insulation layers. The first insulation layer is cut in a first area and the second insulating layer is cut in a second area offset from said first area, to form a first substrate laminated to a second substrate with the base layer interposed therebetween the second substrate having a smaller mounting area than a mounting area of the first substrate such that the first substrate extends beyond an edge of the second substrate. A thickness of a portion of the base substrate that is not sandwiched between the first substrate and the second substrate is cut to be thinner than a portion of the base substrate sandwiched between the first substrate and the second substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 7P is a view illustrating wiring boards according to an embodiment of the present invention

FIG. 16A is a cross-sectional view of a wiring board according to an embodiment of the present invention.

FIG. 16B is a cross-sectional view of a wiring board according to an embodiment of the present invention.

DETAILED DESCRIPTION OF EMBODIMENTS

In the following, an embodiment of a wiring board according to a specific example of the present invention is described with reference to the drawings.

Figure 1A:
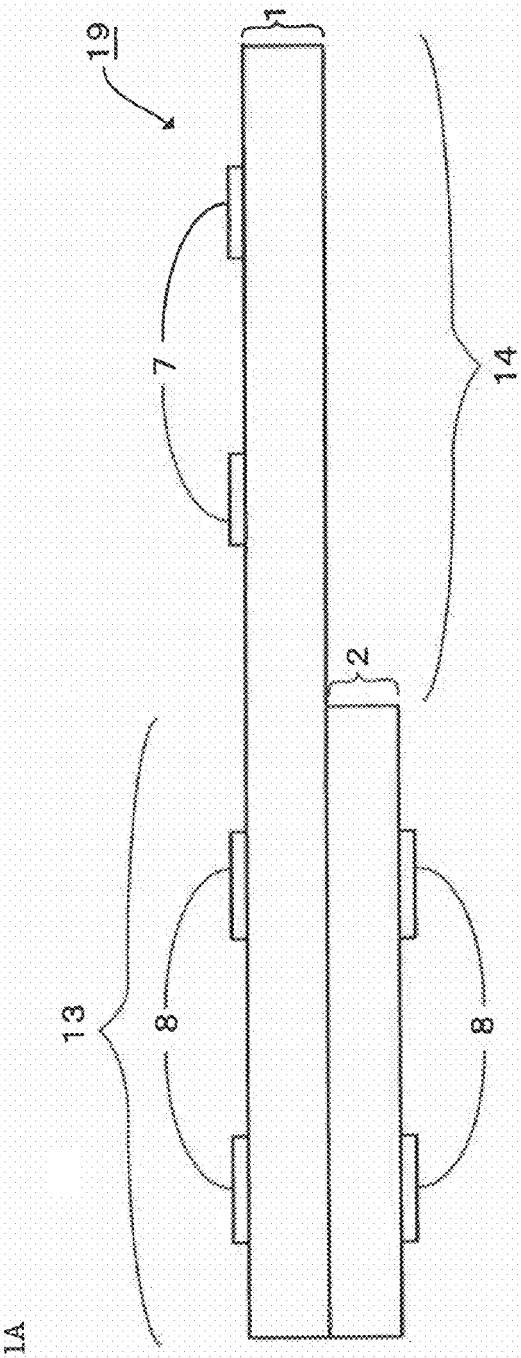
FIG. 1A is a side view illustrating a wiring board according to an embodiment of the present invention.

As shown in FIG. 1A, wiring board 19 according to a specific example of the present invention has a different thickness on one edge from that on the other edge. The number of layers in the section having a different thickness (thicker section) differs from the number of layers in the thinner section. Namely, wiring board 19 has thick multi-layer section 13 and relatively thin fewer-layer section 14. Multi-layer section 13 is structured by laminating two layers, first substrate 1 and second substrate 2. Fewer-layer section 14 has first substrate 1, which is extended from multi-layer section 13. Thus, as used herein, the term "multi-layer section" means two or more layers or boards, while the term "fewer layer section" means one or more layers or boards.

Figure 1B:
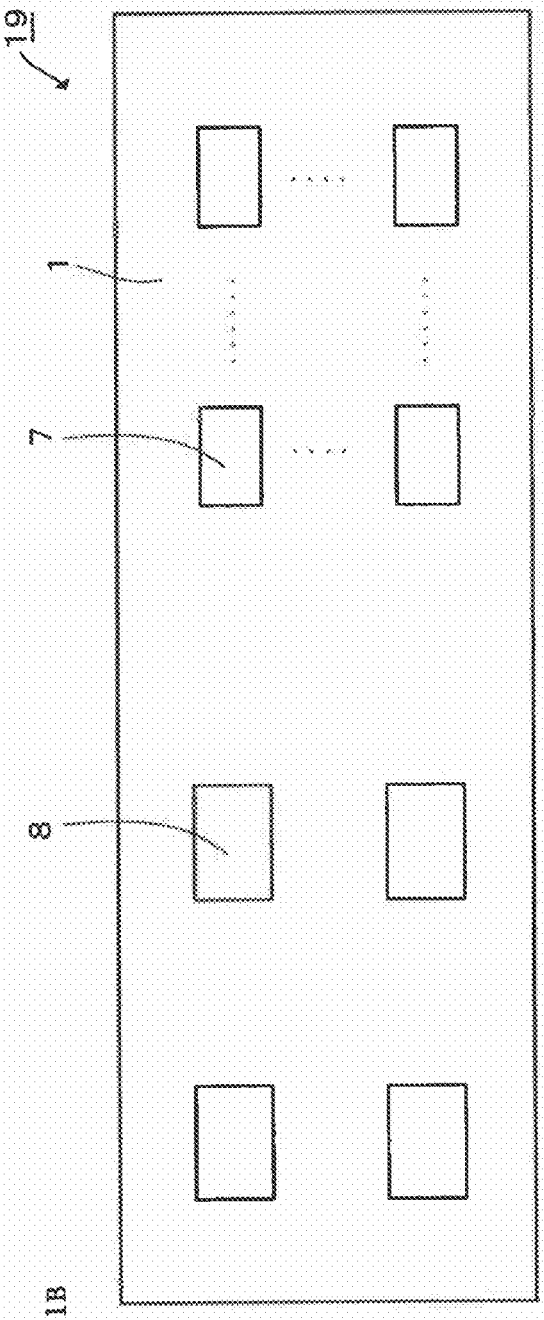
FIG. 1B is a plan view illustrating a wiring board according to an embodiment of the present invention.

As shown in FIGS. 1A and 1B, first substrate 1 and second substrate 2 have the same width and different lengths, and one end of first substrate 1 is aligned with one end of second substrate 2 such that another end of the first substrate extends beyond the second substrate. However, it is not necessary for any ends of the first and second substrates to be aligned, as will be discussed further below. In the embodiment of FIGS. 1A and 1B, the first substrate 1 and second substrate 2 are each formed with non-pliable base material such as epoxy resin.

On the surfaces (mounting surfaces) of first substrate 1 and second substrate 2, connection pads to connect electronic components are formed; on the surfaces (mounting surfaces) and inside first substrate 1 and second substrate 2, wiring patterns to structure electrical circuits are formed. On the mounting surfaces of first substrate 1 and second substrate 2, electronic components 7, 8 are arranged and connected to connection pads according to their requirements. Electronic components 7, 8 are connected with each other through connection pads and wiring patterns.

Wiring board 19 is placed, for example, in the casing of a cell phone device. In such a circumstance, electronic component 7 placed in fewer-layer section 14 is structured, for example, with the keypad of a keyboard; and electronic component 8 placed in multi-layer section 13 is structured with an electronic chip, IC module, functional components and others, for example. Also, in the step portion formed by multi-layer section 13 and fewer-layer section 14, for example, a thin-type battery is placed.

Figure 2:
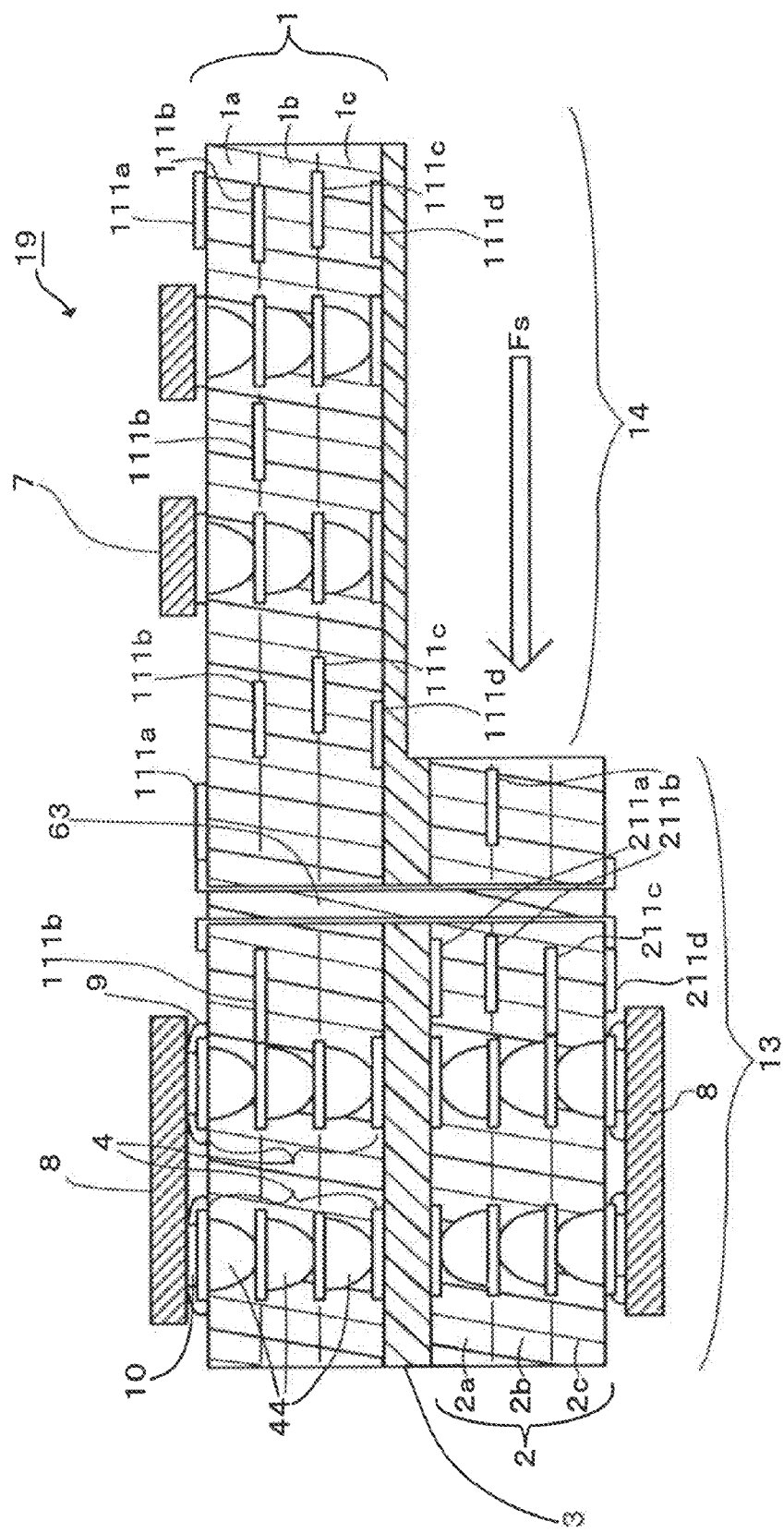
FIG. 2 is a cross-sectional view illustrating a wiring board according to an embodiment of the present invention.

Next, a detailed structure of wiring board 19 having the above overall structure is described in reference to FIG. 2. As illustrated, first substrate 1 and second substrate 2 are laminated with base substrate 3 provided in between. One end (the left end as illustrated in the drawing) of base substrate 3 is made to be flush with first substrate 1 and second substrate 2. Thus, the base substrate 3 is laminated between the first substrate and the second substrate such that the first substrate 1 extends beyond an edge of the second substrate 2. Alternatively, only an almost middle region of the wiring board 19 can be a thick multilayer section while opposing ends of the wiring board are each a thinner fewer layer section. An example of the almost middle region is the area in FIG. 2 between one cross section line (not shown) through the edge of the second substrate which forms the step structure, and another cross section line (not shown) through an edge of components 8 which is closest to the through hole 63. Still alternatively, the first substrate 1 and second substrate 2 having the same width and different lengths can be arranged such that opposing ends of the first substrate 1 each extend beyond the second substrate 2 as shown in the examples in FIGS. 16A and 16B, which will be further discussed below.

However, it is not necessary to have any peripheral edges of the first and second substrate aligned. That is, the wiring board can have an entire peripheral region (for example, formed by the first substrate 1 alone or second substrate 2 alone) that is thinner than an interior non-peripheral region (for example, formed by the first and second substrates together). Thus, according to embodiments of the invention, at least a central portion of the wiring board is a thicker multi layer section, and at least a portion of the periphery of the wiring board is a thinner fewer layer section. As used herein "central portion" means a non-peripheral area of the wiring board having a thicker multilayer section, but does not mean the geometric center of the wiring board.

In base substrate 3, the thickness of the portion bonded only to first substrate 1 is made less than that of the portion sandwiched between first substrate 1 and second substrate 2. Namely, in base substrate 3, the thickness of the portion positioned at fewer-layer section 14 is made less than that of the portion positioned at multi-layer section 13. In this example, the thickness of base substrate 3 positioned at fewer-layer section 14 is made one-half of the thickness of base substrate 3 positioned at multi-layer section 13. The thickness of base substrate 3 positioned at fewer-layer section 14 is preferably made 0.2-0.5 times as thick as that of base substrate 3 positioned at multi-layer section 13.

One or more of the base substrate the first substrate or the second substrate can include a pliable resin. In the embodiment of FIG. 2, base substrate 3 is made of a highly rigid material such as glass epoxy resin. Base substrate 3 is made 50-100 μm, preferably about 100 μm.

First substrate 1 is structured by laminating multiple insulation layers (1a, 1b, 1c). Each insulation layer is made of epoxy resin or the like with a thickness of approximately 10 μm-60 μm. On the upper surface of insulation layer 1a, between epoxy-resin layers 1a and 1b, between insulation layers 1b and 1c and on the lower surface of insulation layer 1c, wiring patterns (111a, 111b, 111c, 111d) are formed respectively. Each wiring pattern (111a, 111b, 111c, 111d) electrically connects required portions inside the circuit substrate.

Second substrate 2 is also structured by laminating multiple insulation layers (2a, 2b, 2c) made of epoxy resin or the like with a thickness of approximately 10 μm-60 μm. On the lower surface of insulation layer 2a, between epoxy-resin layers 2a and 2b, between insulation layers 2b and 2c and on the upper surface of insulation layer 2c, wiring patterns (211a, 211b, 211c, 211d) are formed respectively. Each wiring pattern (211a, 211b, 211c, 211d) electrically connects required portions inside the circuit substrate.

Keypad 7 is placed on the conductive pattern formed on the surface of fewer-layer section 14. Further, using solder 9, electronic chip 8 is anchored and connected to wiring patterns and built-up vias 4 through connection pads 10. For solder 9, Sn/Ag/Cu was used.

Moreover, through-hole 63 is formed, penetrating base substrate 3, further penetrating first substrate 1 and second substrate 2, and connecting wiring pattern 111a of first substrate 1 and wiring pattern 211d of second substrate 2. The inner surface of through-hole 63 is plated so as to electrically connect wiring patterns. The area enveloped by plated through-hole 63 may be filled with resin such as epoxy-resin. The term "through-hole" refers to an electrical connection between conductors using a hole or aperture. In general, a through-hole may be referred to as a platted through-hole. A through-hole can provide a conductive connection between a conductor formed on one end of the through-hole to a conductor formed on the other end of the through-hole. For example, a through-hole can provide a conductive connection between outer layers of a multi-layer printed circuit board and/or may provide conductive connection to or between inner circuits of a multilayer printed circuit board. In forming a through-hole, a penetrating hole is first formed by drilling, and a conductor is formed in the penetrating hole by metal plating (such as copper plating). In addition to providing electrical connection as noted above, a through-hole can receive the terminal of an electronic part for insertion mounting and fixing the electronic part to a printed circuit board.

Figure 3:
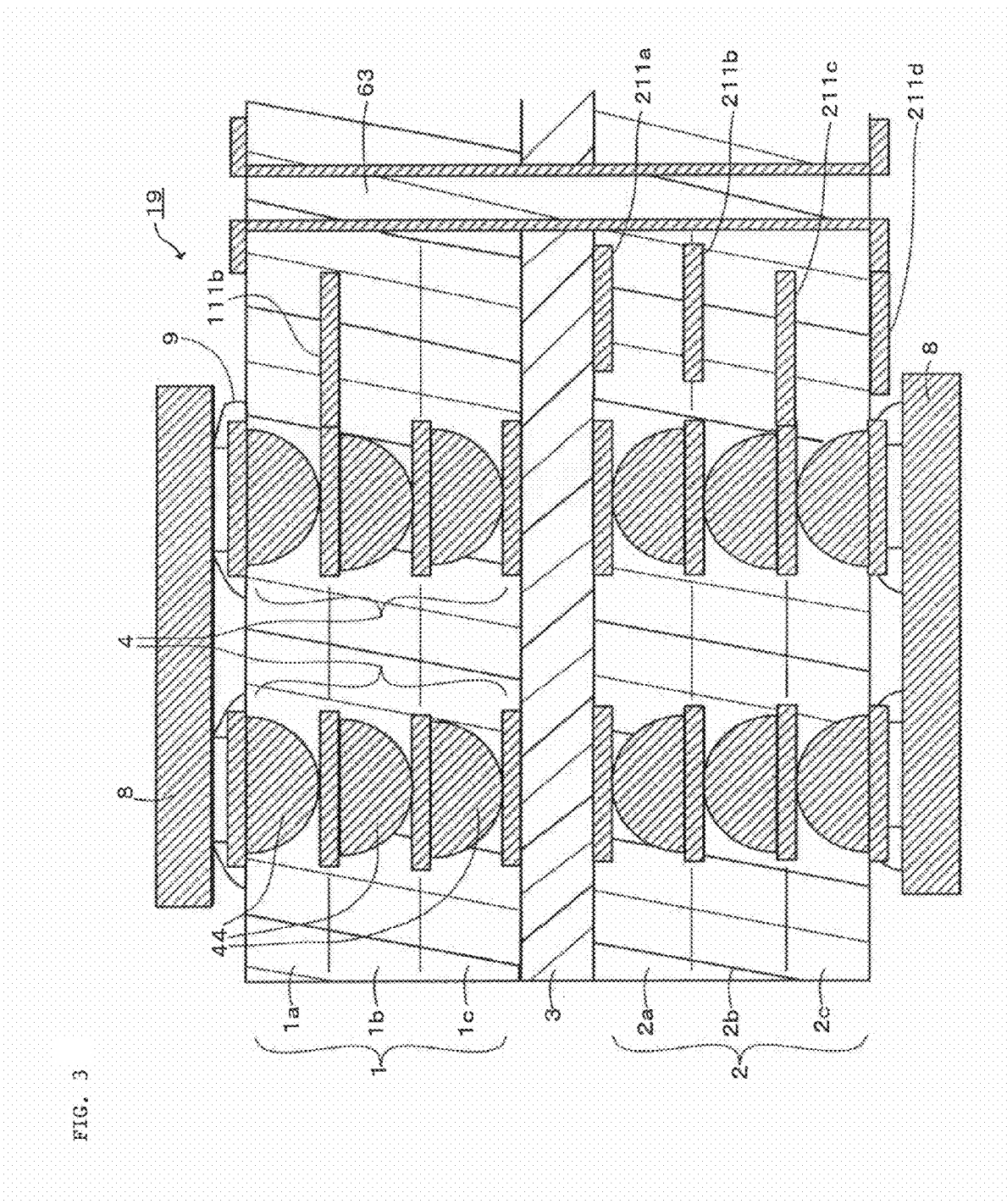
FIG. 3 is a cross-sectional view illustrating a wiring board according to an embodiment of the present invention.
Figure 4:
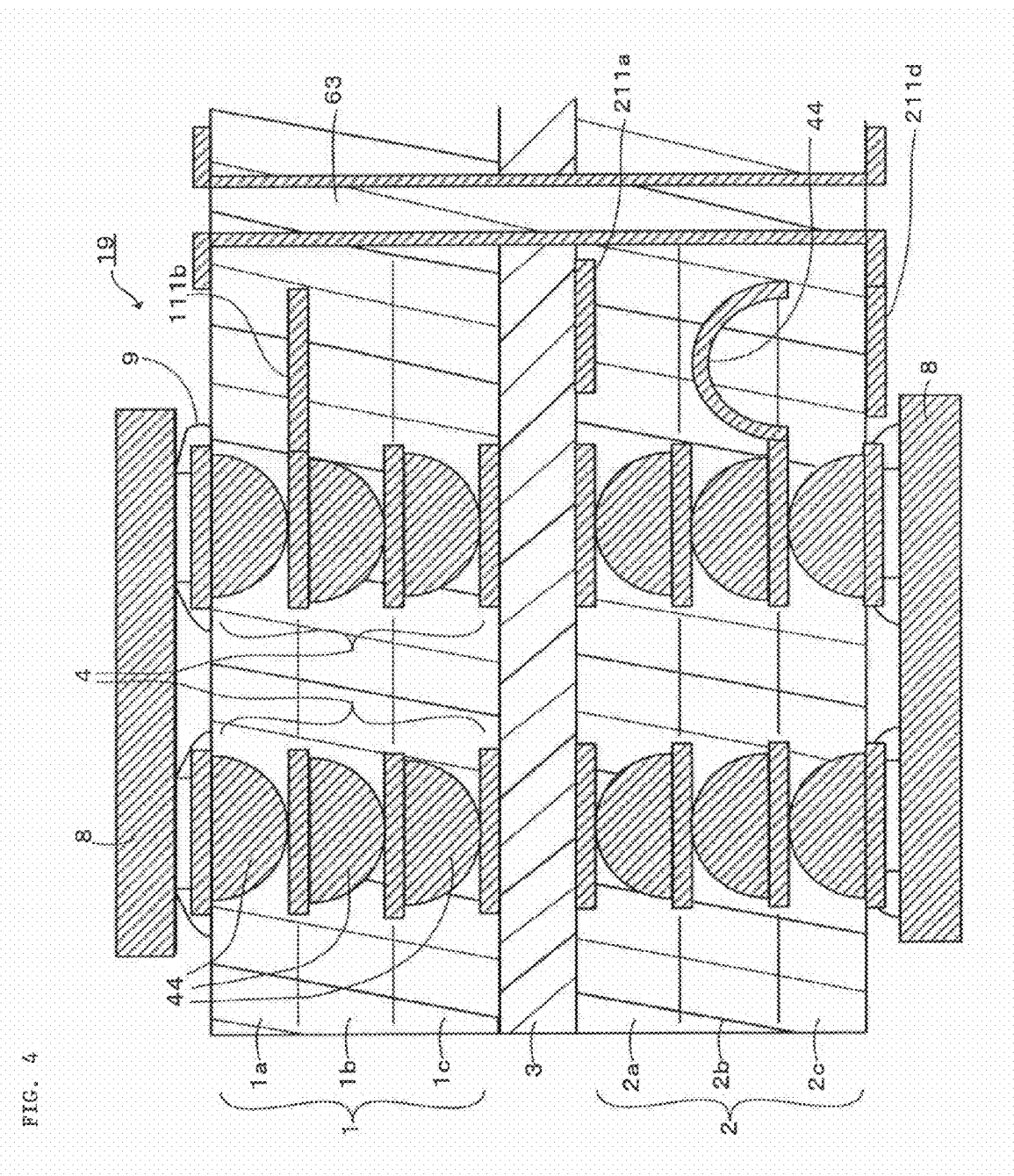
FIG. 4 is a cross-sectional view illustrating a wiring board according to an embodiment of the present invention.

In first substrate 1 and second substrate 2, multiple built-up vias 4 are formed. Built-up vias 4 are structured by stacking vias 44 formed in each insulation layer (1a-1c, 2a-2c). Built-up vias 4 connect required portions of wiring patterns (111a-111d) and also connect required portions of wiring patterns (211a-211d). On the inner surface of each via 44 forming built-up via 4, a conductive layer made of plated copper or the like is formed. As shown in FIG. 3, the interior of each via 44 is filled with conductor such as copper. However, as shown in FIG. 4, the interior of via 44 may be filled with resin such as epoxy-resin. Thus, the term "via" as used herein, means an opening formed in a substrate such as an insulating layer.

Wiring board 19 having the above structure, for example, transmits operational signals from keypad 7 to an IC chip through built-up vias 4, wiring patterns (111a-111d) and through-hole 63, and the signals are then processed at the IC chip. By doing so, varieties of signal processing may be conducted.

Also, as described above, wiring board 19 is structured with multi-layer section 13 and fewer-layer section 14 and has a step portion. At the lower portion of fewer-layer section 14, a large-volume component such as a cell-phone battery may be placed.

In the embodiment of FIG. 2, base substrate 3 is made of highly rigid material such as glass-epoxy resin. Multi-layer section 13, because relatively thick base substrate 3 is positioned there, is highly rigid compared with fewer-layer section 14. On the other hand, fewer-layer section 14 is relatively flexible compared with multi-layer section 13. Thus, it is possible to place electronic components on either sections 13 or 14 according to the reliability level they require.

Figure 5:
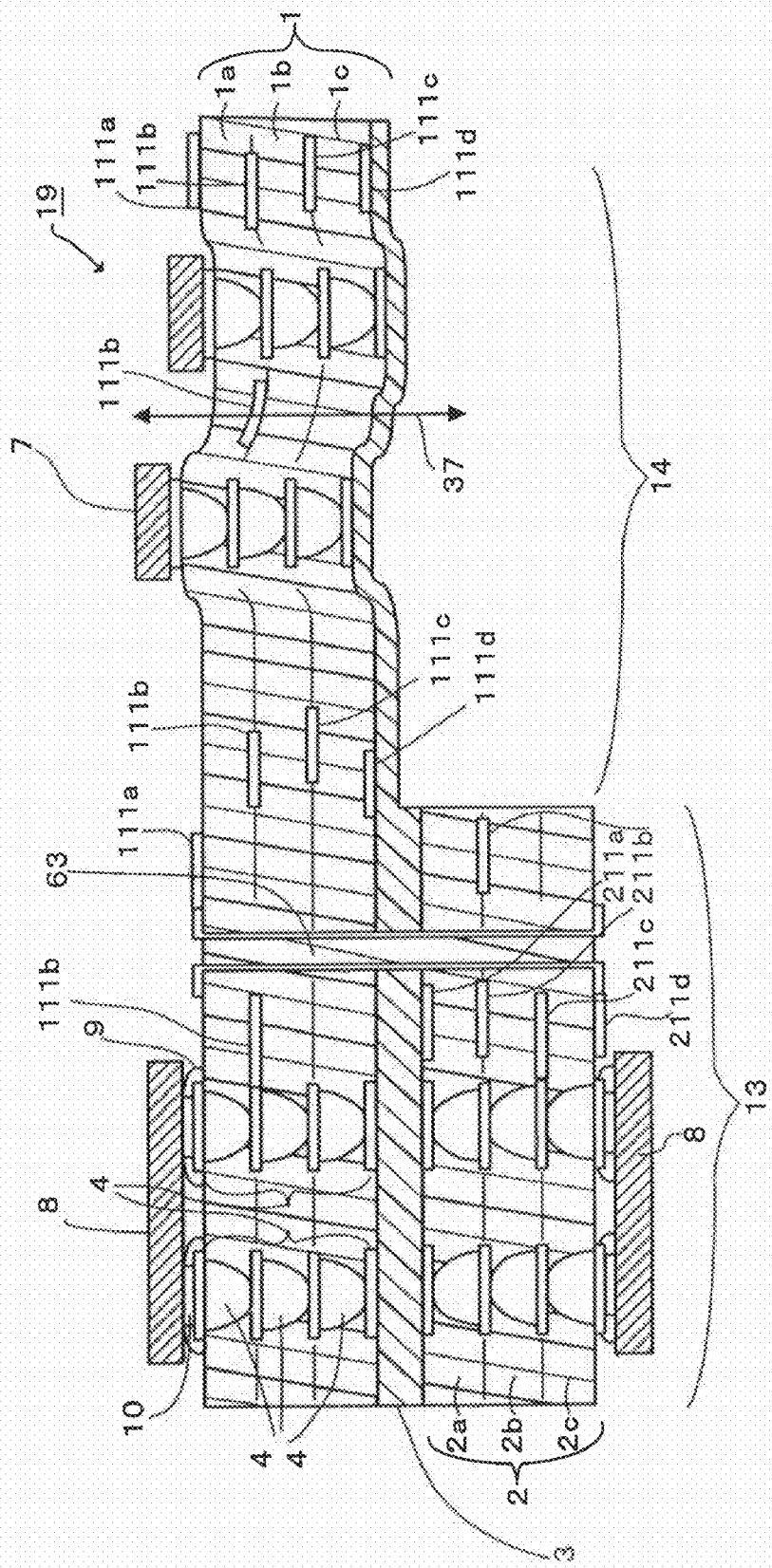
FIG. 5 is a cross-sectional view illustrating a wiring board according to an embodiment of the present invention.

Also, when the electronic device is dropped and an impact or the like is exerted on wiring board 19, due to the relative flexibility of fewer-layer section 14 compared with multi-layer section 13, fewer-layer section 14 vibrates as shown by arrow 37 in FIG. 5. Since portions of fewer-layer section 14 vibrate, the impact from being dropped or the like is converted to vibration motion energy, and the impact is absorbed accordingly. As a result, the risk of rupture in the wiring that connects the electronic components mounted on wiring board 19 may be minimized.

Also, built-up via 4 has a stacked via structure with laminated multiple vias 44. By making such a stacked interlayer connection structure, the wiring length is shortened, and thus preferable for mounting electronic components requiring large amounts of electricity.

Figure 6:
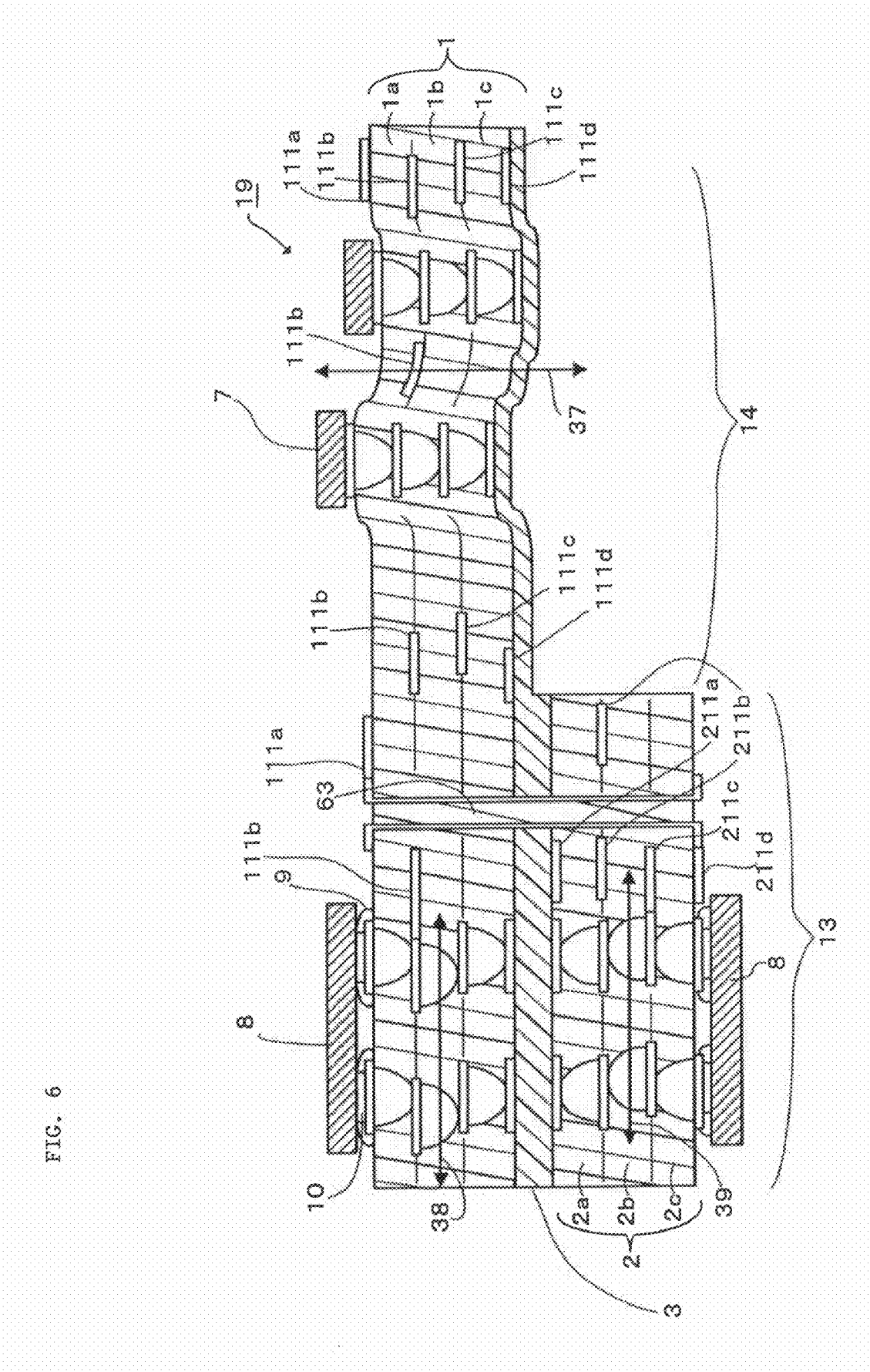
FIG. 6 is a cross-sectional view illustrating a wiring board according to an embodiment of the present invention.

Moreover, built-up via 4 has a certain degree of mobility. Therefore, when the electronic device is dropped and an impact is exerted, for example, on wiring board 19, as shown by arrows 38, 39 in FIG. 6, through the movement of built-up via 4, the impact may be absorbed at built-up via 4. As a result, the risk of rupture of the wiring that connects the electronic components mounted on wiring board 19 may be minimized.

In addition, through-hole 63, which penetrates base substrate 3, is formed and the inner surface of through-hole 63 is plated (or filled with resin). Thus, as shown in FIG. 2, if shearing force (Fs) is exerted on the wiring board from a horizontal direction, through-hole 63 may counter the shearing force, thus preventing first substrate 1 and second substrate 2 from sliding.

Further, the portion of base substrate 3 bonded only to fewer-layer section 14 can minimize or prevent wiring board 19 from warping. Multi-layer section 13, having a multi-layered structure, is made rigid compared with fewer-layer section 14. Thus, at multi-layer section 13, warping seldom occurs. On the other hand, fewer-layer section 14 is made flexible compared with multi-layer section 13. Thus, at fewer-layer section 14, warping may possibly occur. However, at the lower portion of fewer-layer section 14, thin base substrate 3 is bonded. Thin base substrate 3 supports fewer-layer section 14. Therefore, warping at fewer-layer section 14 may be minimized.

In the following, a method of manufacturing wiring board 19 according to the present invention is described.

Figure 7A:
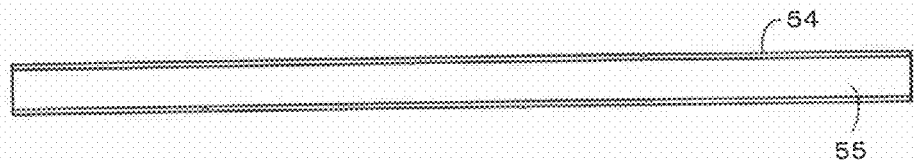
FIG. 7A illustrates a step of a method to manufacture a wiring board according to an embodiment of the present invention.

First, as shown in FIG. 7A, core 55, which functions as base substrate 3, is prepared. Core 55 is made, for example, of highly rigid material such as glass-epoxy resin. On both surfaces of core 55, copper foil 54 is deposited.

Figure 7B:
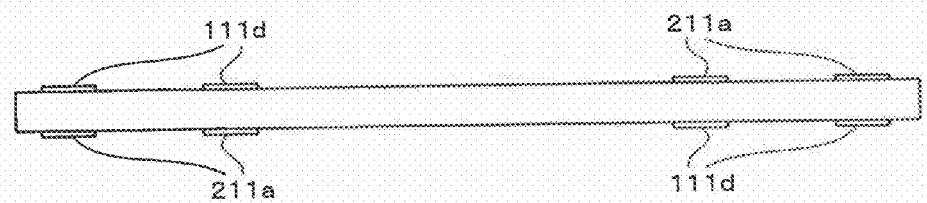
FIG. 7B illustrates a step of a method to manufacture a wiring board according to an embodiment of the present invention.

Next, as shown in FIG. 7B, by patterning copper foil 54, conductive patterns (111d, 211a) are formed to structure wiring patterns.

Figure 7C:
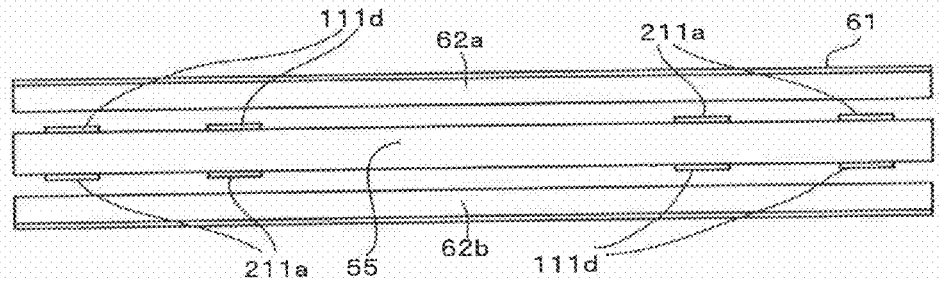
FIG. 7C illustrates a step of a method to manufacture a wiring board according to an embodiment of the present invention.

Next, as shown in FIG. 7C, on the top and bottom of core 55, prepreg (62a, 62b) are laminated. For prepreg (62a, 62b), low-flow prepreg impregnated with low-flow epoxy-resin is preferred. Then, on the surfaces of prepreg (62a, 62b), copper foil 61 is placed.

Figure 7D:
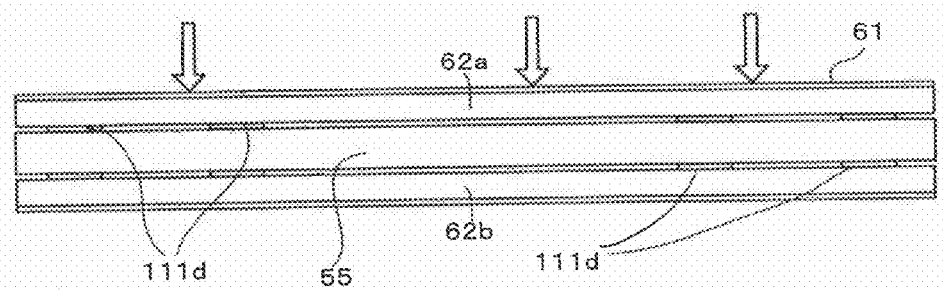
FIG. 7D illustrates a step of a method to manufacture a wiring board according to an embodiment of the present invention

Next, as shown in FIG. 7D, on the laminate shown in FIG. 7C, pressure is applied, as represented by the arrows in FIG. 7D. Pressure is, for example, applied by hydraulic power using hydraulic pressing equipment under conditions calling for a temperature of 200° C., pressure of 40 kgf and pressing time of three (3) hours. By doing so, resin is squeezed from the prepreg (62a, 62b), and the prepreg and core material are integrated accordingly. For applying pressure, vacuum pressing may be employed instead of hydraulic pressing. By conducting vacuum pressing, bubbles may be prevented from mixing into the resin which structures the insulation layers. Vacuum pressing is conducted, for example, for an hour. Peak heating temperature is set, for example, at 175° C. Vacuum-pressing pressure is set, for example, at $3.90 \times 10^6$ [Pa].

Figure 7E:
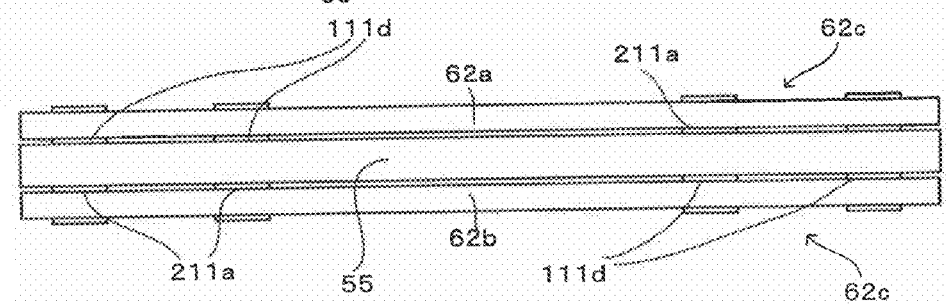
FIG. 7E illustrates a step of a method to manufacture a wiring board according to an embodiment of the present invention.

Next, as shown in FIG. 7E, by removing the unnecessary portions of copper foil 61, inner-layer patterns 62c are formed.

Figure 7F:
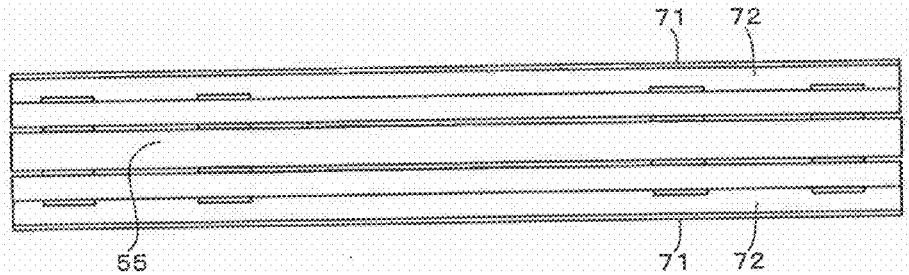
FIG. 7F illustrates a step of a method to manufacture a wiring board according to an embodiment of the present invention

Next, as shown in FIG. 7F, epoxy resin 72 is further laminated to form inner layers. On both surfaces of epoxy resin 72, copper foil 71 is formed.

Figure 7G:
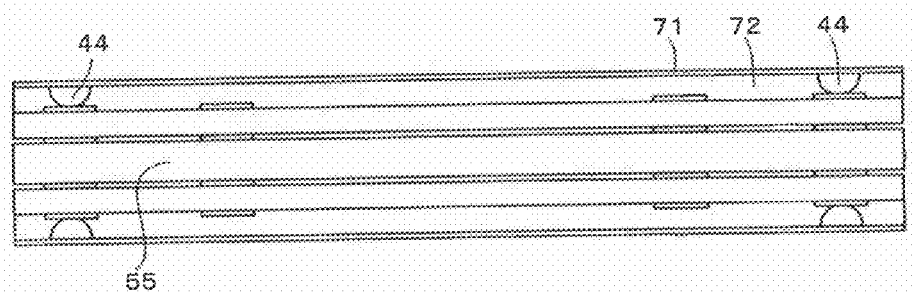
FIG. 7G illustrates a step of a method to manufacture a wiring board according to an embodiment of the present invention.

Next, as shown in FIG. 7G, vias 44 are formed. Namely, in epoxy resin 72 made of insulation resin, openings for via-holes are formed. Those openings may be formed by use of a laser beam. Then, to remove resin residue remaining on the side and bottom surfaces of the openings formed by the laser beam, a desmear treatment is performed. The desmear treatment is performed by an oxygen plasma discharge treatment, a corona discharge treatment, an ultra-violet laser treatment or an exima laser treatment. In the openings formed by the laser beam, conductive material is filled to form filled via holes. As for conductive material, conductive paste or metal plating formed by an electrolytic plating process is preferred. For example, vias 44 are filled with conductor such as copper plating. To reduce the manufacturing cost and improve the productivity by simplifying the filled-via forming step, filling with a conductive paste is preferred. For example, a conductive paste (such as thermo-set resin containing conductive particles) may be printed by screen-printing, filled in vias 44 and cured. By filling the interiors of vias 44 with the same conductive paste material, connection reliability when thermo-stress is exerted on vias 44 may be improved. On the other hand, regarding connection reliability, metal plating formed by an electrolytic plating process is preferred. Especially, electrolytic copper plating is preferred.

Figure 7H:
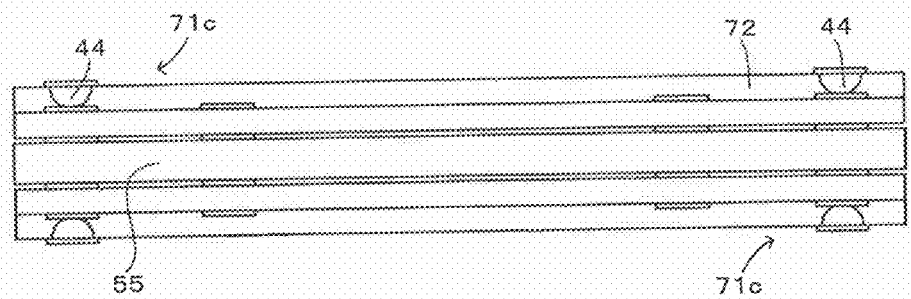
FIG. 7H illustrates a step of a method to manufacture a wiring board according to an embodiment of the present invention

Next, as shown in FIG. 7H, by removing the unnecessary portions of copper foil 71, inner-layer patterns 71c are formed.

Figure 7I:
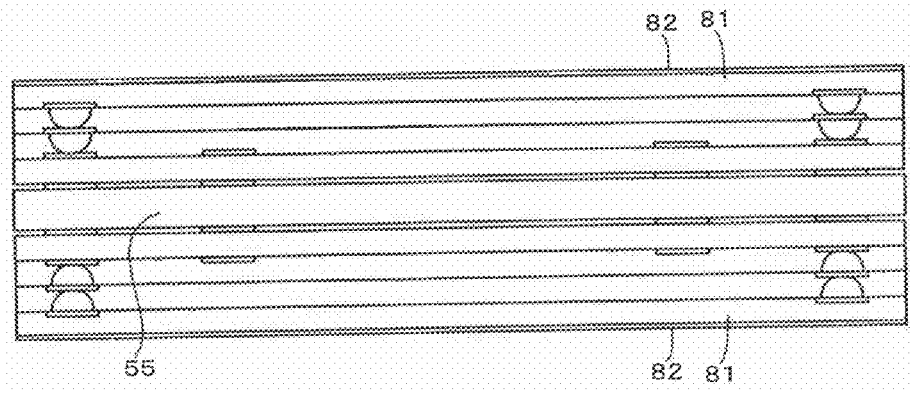
FIG. 7I illustrates a step of a method to manufacture a wiring board according to an embodiment of the present invention

Next, as shown in FIG. 7I, after inner layers and vias are further formed, epoxy-resin 81 is laminated to form outer layers. On both surfaces of epoxy-resin 81, copper foil 82 is deposited. Here, a copper foil sheet containing resin (Resin Copper Film: RCF) may be positioned and pressed.

Figure 7J:
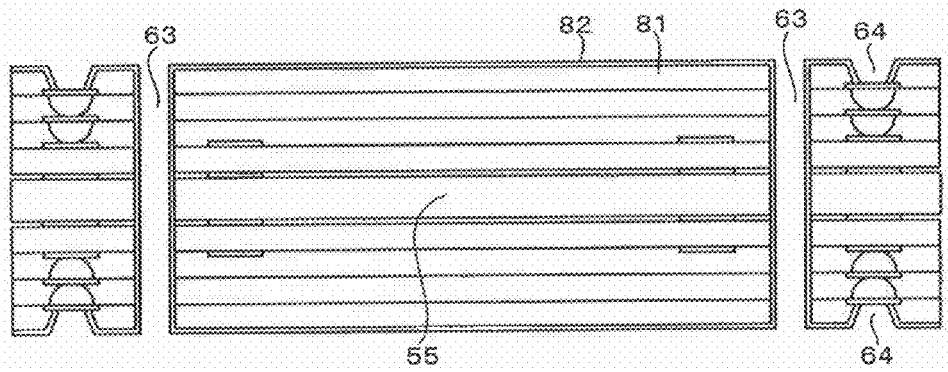
FIG. 7J illustrates a step of a method to manufacture a wiring board according to an embodiment of the present invention

Next, as shown in FIG. 7J, vias 64 are formed in the RCF. Further, in the laminate shown in FIG. 7I, holes are opened by a drill. In the embodiment of FIG. 7J, the holes penetrate the base substrate and insulation layers formed on both sides of the base substrate. By doing so, through-holes 63 are formed. Then, using copper plating or the like, the interiors of the vias 64 and through-holes 63 are filled with conductor. Also, according to requirements, by patterning the surface copper foil, conductive patterns are formed.

Figure 7K:
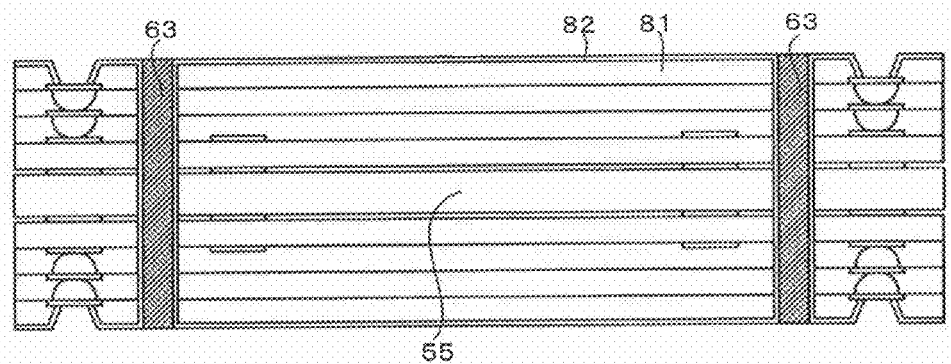
FIG. 7K illustrates a step of a method to manufacture a wiring board according to an embodiment of the present invention
Figure 7L:
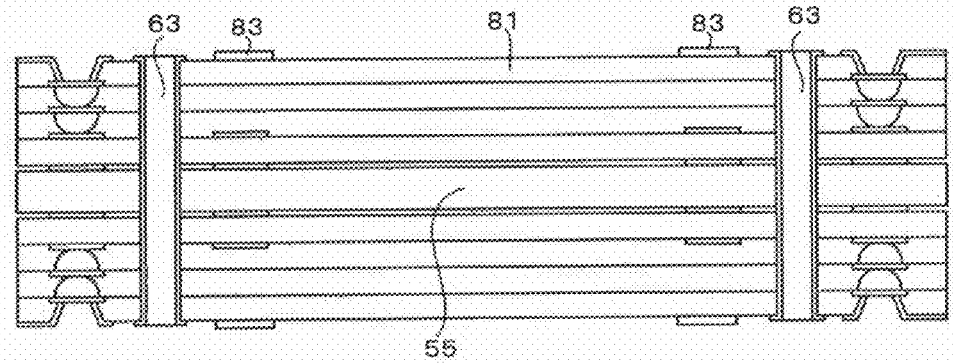
FIG. 7L illustrates a step of a method to manufacture a wiring board according to an embodiment of the present invention

Next, as shown in FIG. 7K, the interiors of through-holes 63 are filled with epoxy resin, and by removing unnecessary portions of copper foils 82, outer-layer patterns are formed as shown in FIG. 7L.

Next, as shown in FIG. 7L, solder resist 83 is formed. Here, the solder resist indicates heat-resistant coating material, which is used when applying solder to cover the portions to keep the solder from adhering. For solder-resist varieties, photo-setting-type solder resist and thermo-setting-type solder resist may be used. For a coating method, a screen-printing method or curtain-coating method may be used.

Figure 7M:
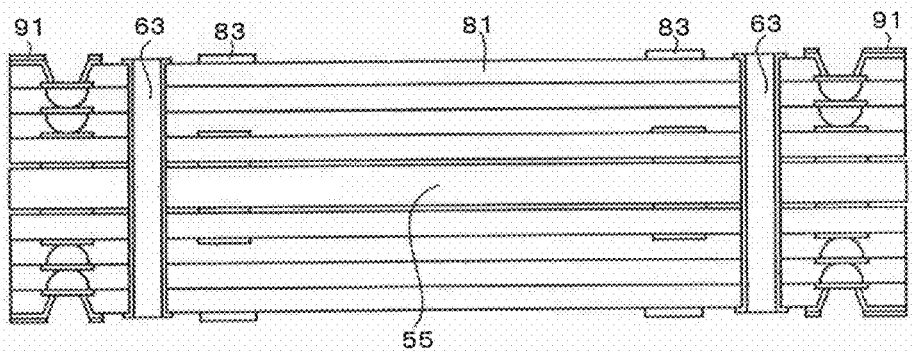
FIG. 7M illustrates a step of a method to manufacture a wiring board according to an embodiment of the present invention

Next, as shown in FIG. 7M, to protect outer-layer patterns, gold plating 91 is performed by chemical plating. Other than chemical plating, methods such as fusion plating and electrical plating may be used. Moreover, other than gold plating, alloy plating may be used.

Figure 7N:
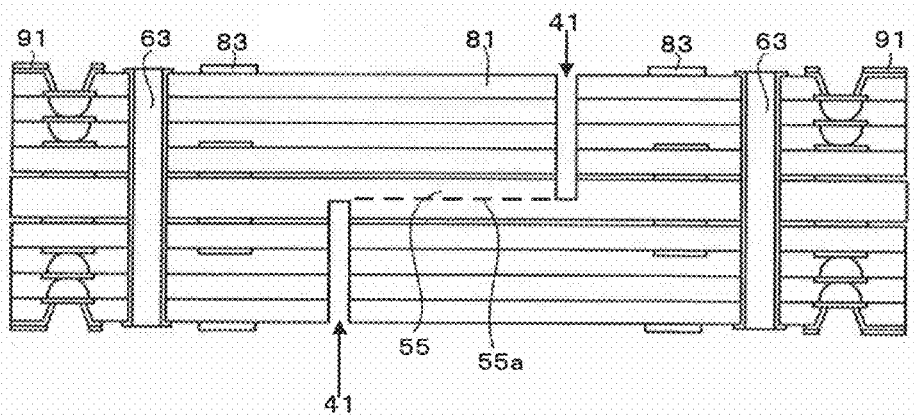
FIG. 7N illustrates a step of a method to manufacture a wiring board according to an embodiment of the present invention

Next, as shown by arrows 41 in FIG. 7N, laser beams from laser processing equipment, for example $CO_2$ laser, are used to cut the insulation layers and the copper foil sheet containing resin (RCF). The arrows 41 in FIG. 7N show laser beams from the thickness direction of the wiring board.

Figure 7O:
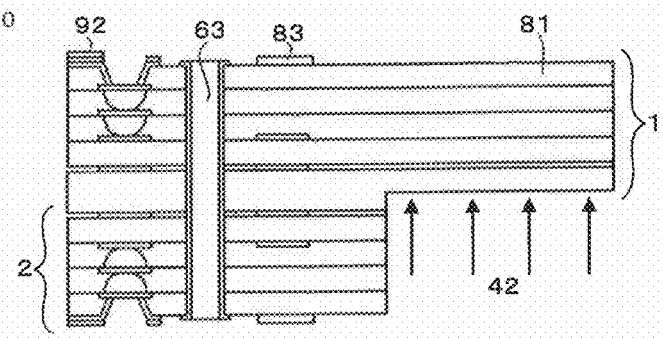
FIG. 7O illustrates a step of a method to manufacture a wiring board according to an embodiment of the present invention

Furthermore, as seen in FIG. 7O, the base layer 55 is divided in a horizontal direction in order to form the thick section and thin section of the base layer 55. In one embodiment, the base layer 55 is divided by use of a spacer 55a embedded within the base layer as shown in phantom in FIG. 7N. While the spacer 55a is schematically shown as a single spacer, more than one spacer may be used. The spacer 55a allows the base layer 55 to be divided in a horizontal direction of FIG. 7N without the need to make an additional cut in this direction. As shown by arrows 42 in FIG. 7O, laser beams from laser processing equipment may be used to further cut the of a portion of base substrate 3 bonded only to first substrate 1 to a desired thickness. Also, by cutting as indicated by arrows 42, first substrate 1 and second substrate 2 having a smaller mounting area than that of first substrate 1 can be obtained. As shown in FIG. 7O, electronic component 92 is mounted. Electronic component 92 is electronic chip 8 or keypad 7, for example.

And, as shown in FIG. 7P, wiring board 19A and wiring board 19B are separated for use. As described, a sheet of core 55 is repeatedly laminated with epoxy resin, and by cutting it with a laser, two wiring boards (19A, 19B) are obtained from one sheet of core. Thus, wiring boards may be manufactured efficiently.

Figure 8:
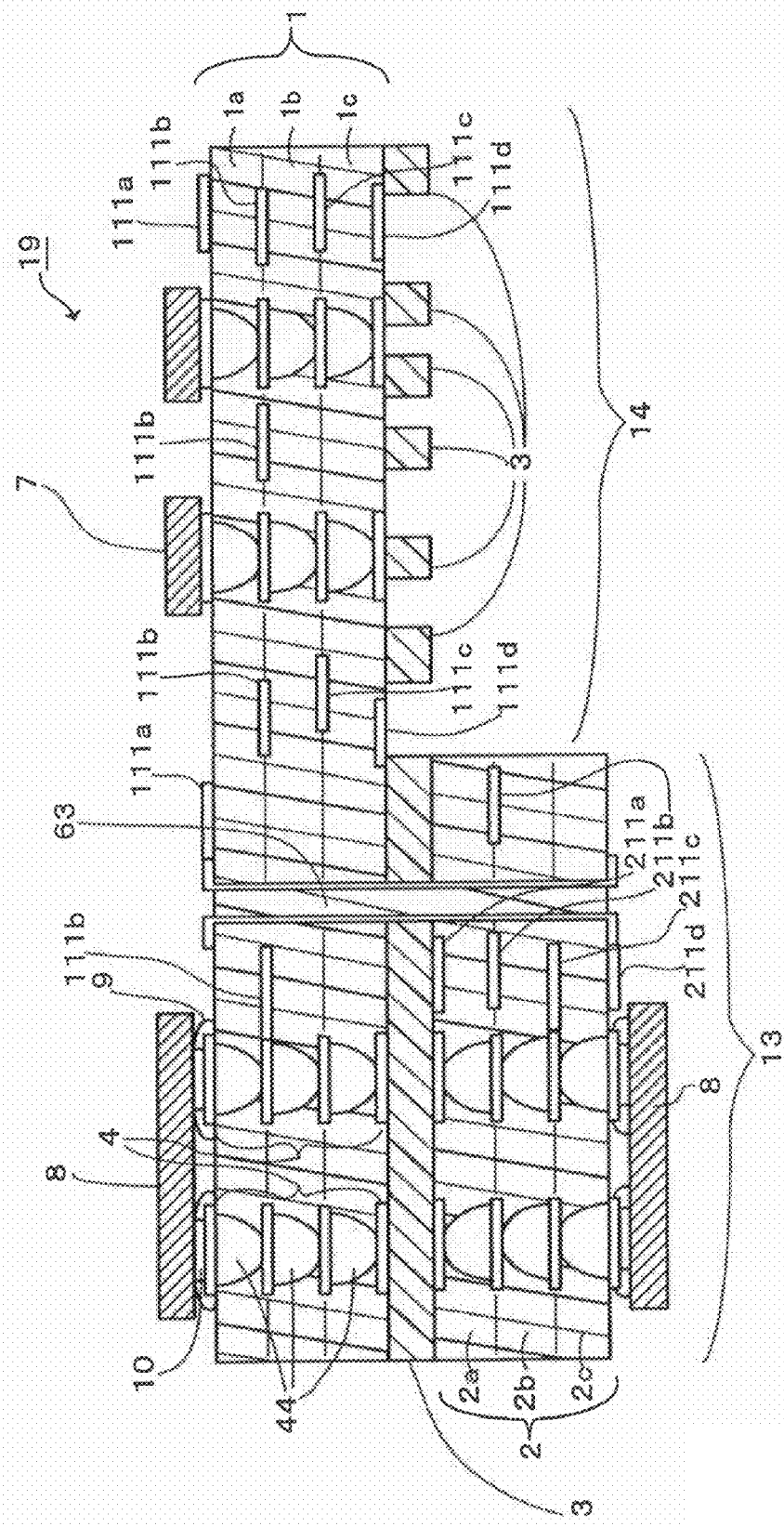
FIG. 8 is a cross-sectional view of a wiring board according to an embodiment of the present invention.

In the following, as shown in FIG. 8, a wiring board according to another embodiment of the present invention is described. In the embodiment of FIG. 8, portions of base substrate 3 bonded only to first substrate 1 are formed intermittently. Namely, portions of base substrate 3 positioned beneath fewer-layer section 14 are formed intermittently. At fewer-layer section 14, since base substrate 3 is formed intermittently, fewer-layer section 14 is flexible compared with multi-layer section 13. Due to the flexibility of fewer-layer section 14, fewer-layer section 14 vibrates. Then, since fewer-layer section 14 vibrates, the impact is converted to vibration motion energy, and the impact is absorbed. As a result, connection reliability of electronic components, which are mounted on first substrate 1 that forms fewer-layer section 14, is enhanced.

Figure 9:
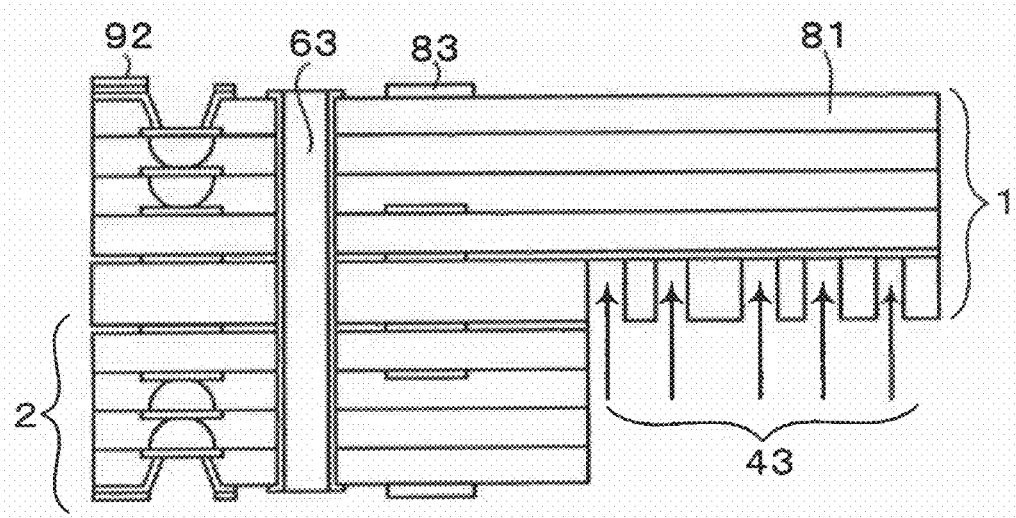
FIG. 9 illustrates a step of a method to manufacture a wiring board according to an embodiment of the present invention

The method of manufacturing a wiring board according to the embodiment of FIG. 8 is the same as the manufacturing method of a wiring board according to the embodiment with reference to FIGS. 7A-7N. However, instead of FIG. 7O, as shown in FIG. 9, by laser beams 43, base substrate 3 is cut intermittently.

Figure 10:
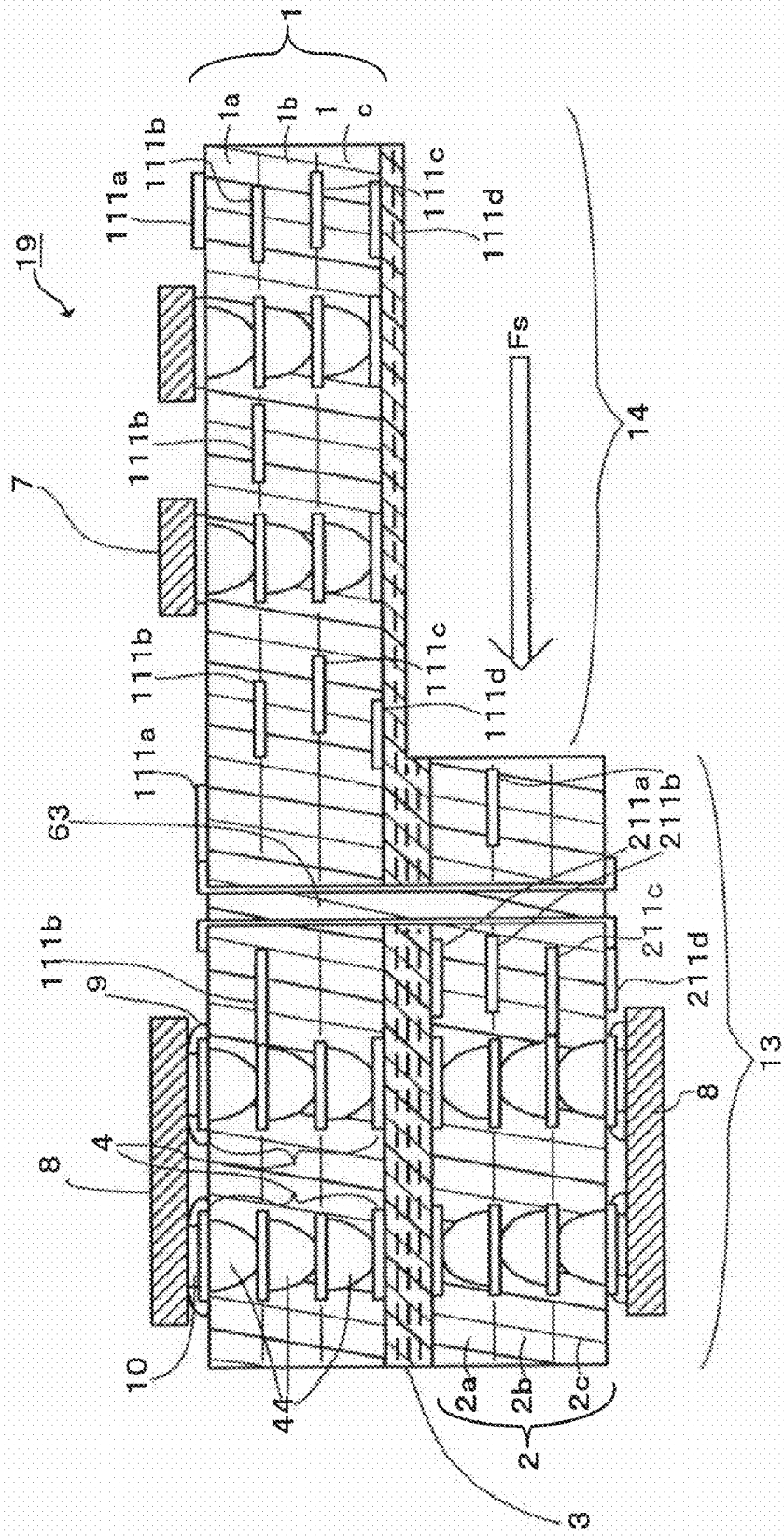
FIG. 10 is a cross-sectional view of a wiring board according to an embodiment of the present invention.
Figure 11:
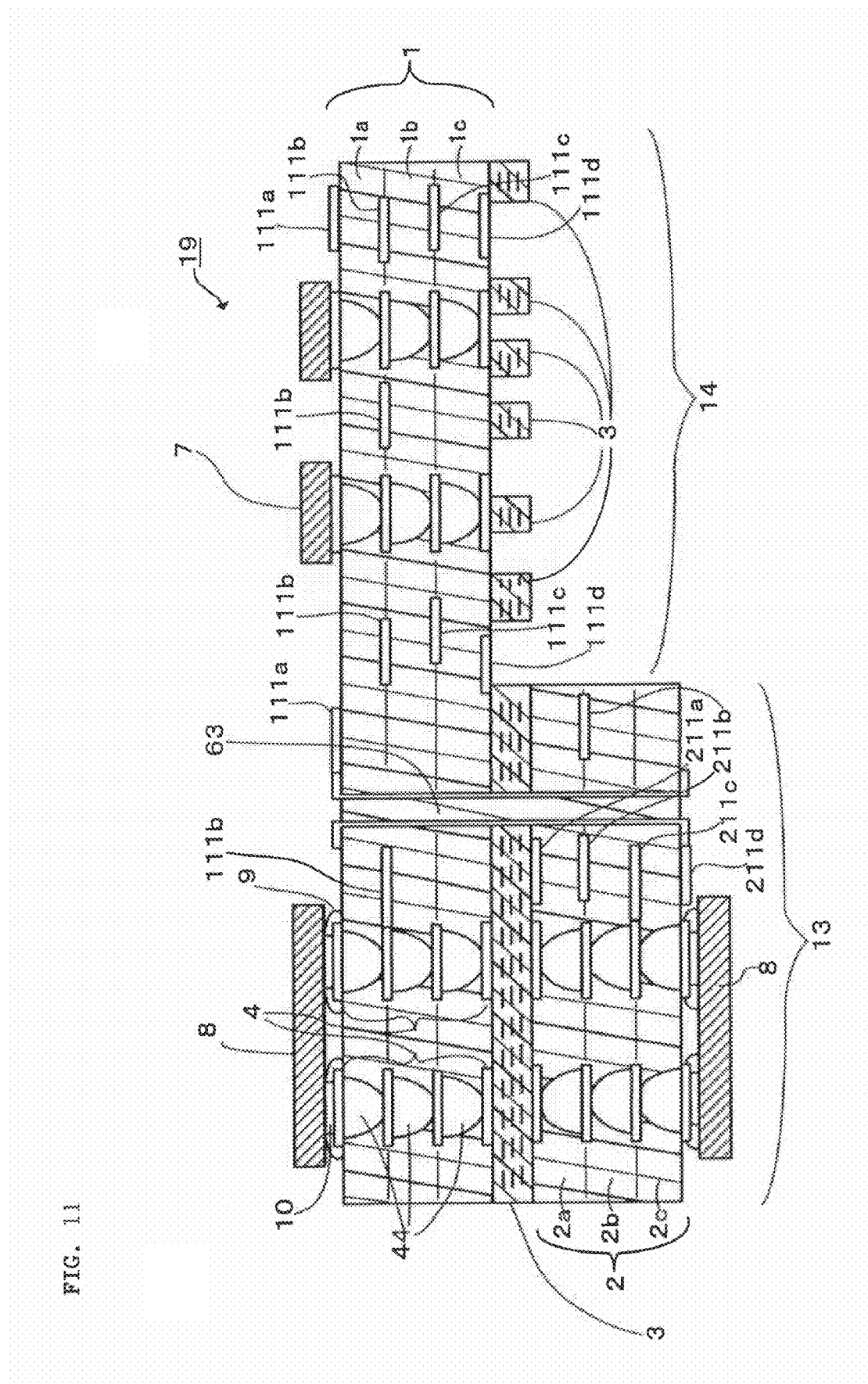
FIG. 11 is a cross-sectional view of a wiring board according to an embodiment of the present invention.

In the embodiment of FIG. 2, base substrate 3 was made of glass-epoxy resin. However, as shown in FIGS. 10 and 11, in other embodiments, base substrate 3 is formed with base material of resin-impregnated inorganic fabric. First substrate 1 and second substrate 2 are structured with pliable resin. By being structured as such, since base substrate 3 contains base material of resin-impregnated inorganic fabric, tolerance to warping may be enhanced.

The base material of resin-impregnated inorganic fabric is made by curing a prepreg. Prepreg is made by impregnating glass-cloth inorganic fabric with epoxy-resin, then preliminarily thermosetting the resin to advance the level of curing. The resin used to make prepreg is preferred to have low-flow characteristics, but a resin with regular-flow characteristics may be used. Also, the prepreg may be formed by reducing the amount of epoxy-resin impregnated in the glass-cloth inorganic fabric.

As for the inorganic fabric, it is not limited to glass cloth; for example, alumina fabric, carbon fabric (carbon fiber), silicon carbide fabric or silicon nitride fabric may be used.

In the method of manufacturing a wiring board according to the embodiments of FIGS. 10 and 11, referring to FIG. 7A, as the material to form core 55, base material of resin-impregnated inorganic fabric is used. Also, referring to FIGS. 7C, 7F and 7I, as the resin to laminate, pliable resin is used. The rest is substantially the same as the method of manufacturing a wiring board according to FIGS. 7A-7P and FIG. 9.

Figure 12:
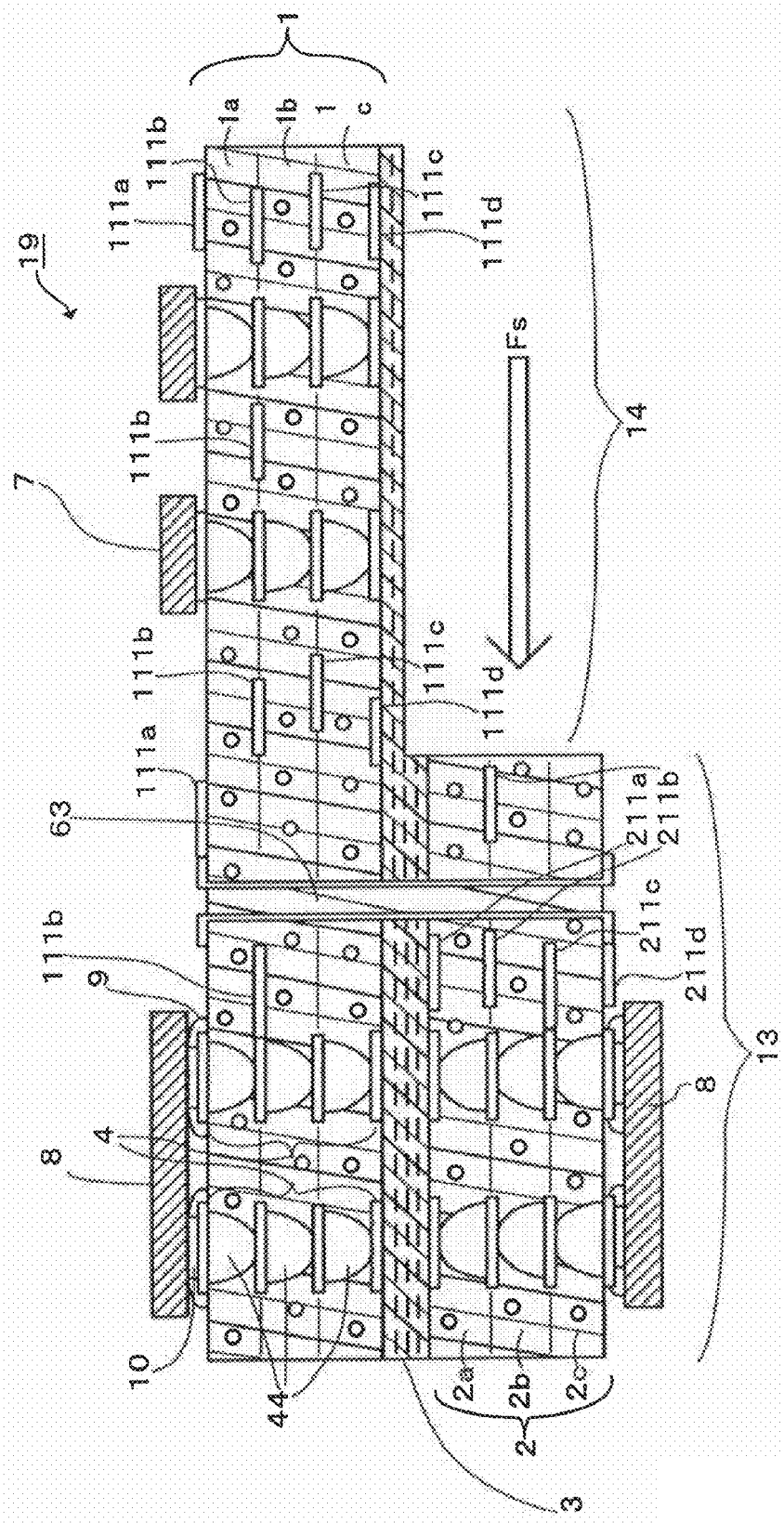
FIG. 12 is a cross-sectional view of a wiring board according to an embodiment of the present invention.
Figure 13:
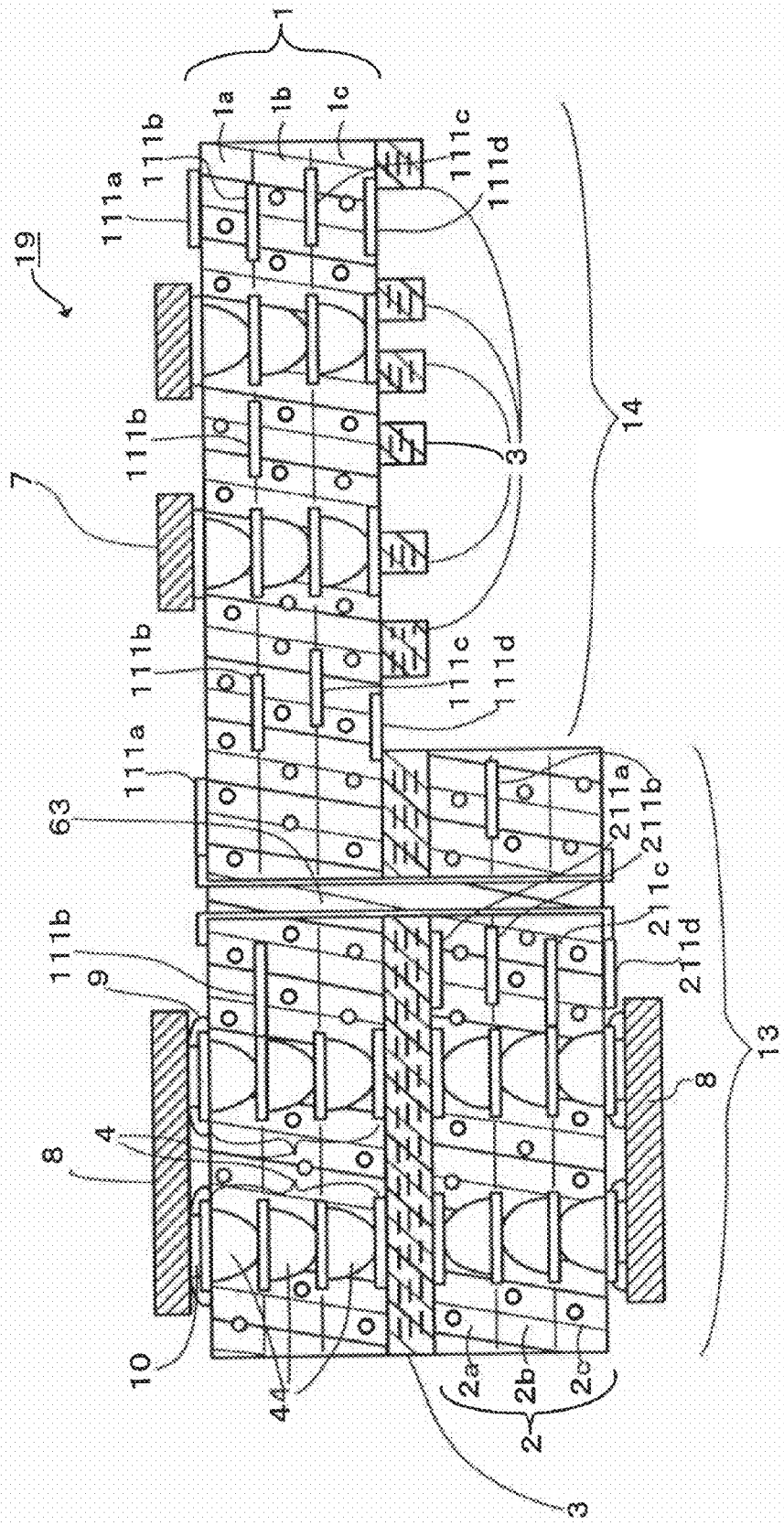
FIG. 13 is a cross-sectional view of a wiring board according to an embodiment of the present invention.

In the above-described embodiment of FIG. 2, base substrate 3 was made of glass-epoxy resin, and first substrate 1 and second substrate 2 were made of epoxy resin. However, the combination of material for base substrate 3 and material for first substrate 1 and second substrate 2 is not limited to such. As shown in FIGS. 12-13, base substrate 3 is formed with base material of resin-impregnated inorganic fabric; and first substrate 1 and second substrate 2 are formed with resin containing inorganic filler. By forming so, since base substrate 3 contains base material of resin-impregnated inorganic fabric, tolerance to warping may be improved. Accordingly, when an electronic device such as a cell phone receives an impact from being dropped or the like, the risk of rupture in the wiring that connects electronic components mounted in the wiring board may be minimized.

Resin containing inorganic filler may be made by combining silica filler or glass filler with epoxy resin. In addition to epoxy resin, or other than epoxy resin, polyimide, polycarbonate, polybutylene-telephtarate or polyacrylate may be used.

For silica filler, fused silica ($SiO_2$) or crystalline silica ($SiO_2$) may be used. Also, for glass filler, aluminum oxide ($Al_2O_3$), magnesium oxide (MgO), boron nitride (BN), or aluminum nitride (AlN) may be used. Furthermore, for inorganic filler, it is not limited to silica filler or glass filler; antimony trioxide, antimony pentaxide or magnesium hydroxide may be used.

In the method of manufacturing a wiring board according to the embodiments of FIGS. 12 and 13, referring to FIG. 7A, as the material to form core 55, base material of resin-impregnated inorganic fabric is used. In addition, for the resin to be laminated in reference to FIGS. 7C, 7F and 7I, resin containing inorganic filler is used. The rest is substantially the same as the method of manufacturing a wiring board according to the embodiment of FIGS. 7A-7P and FIG. 9.

Figure 14:
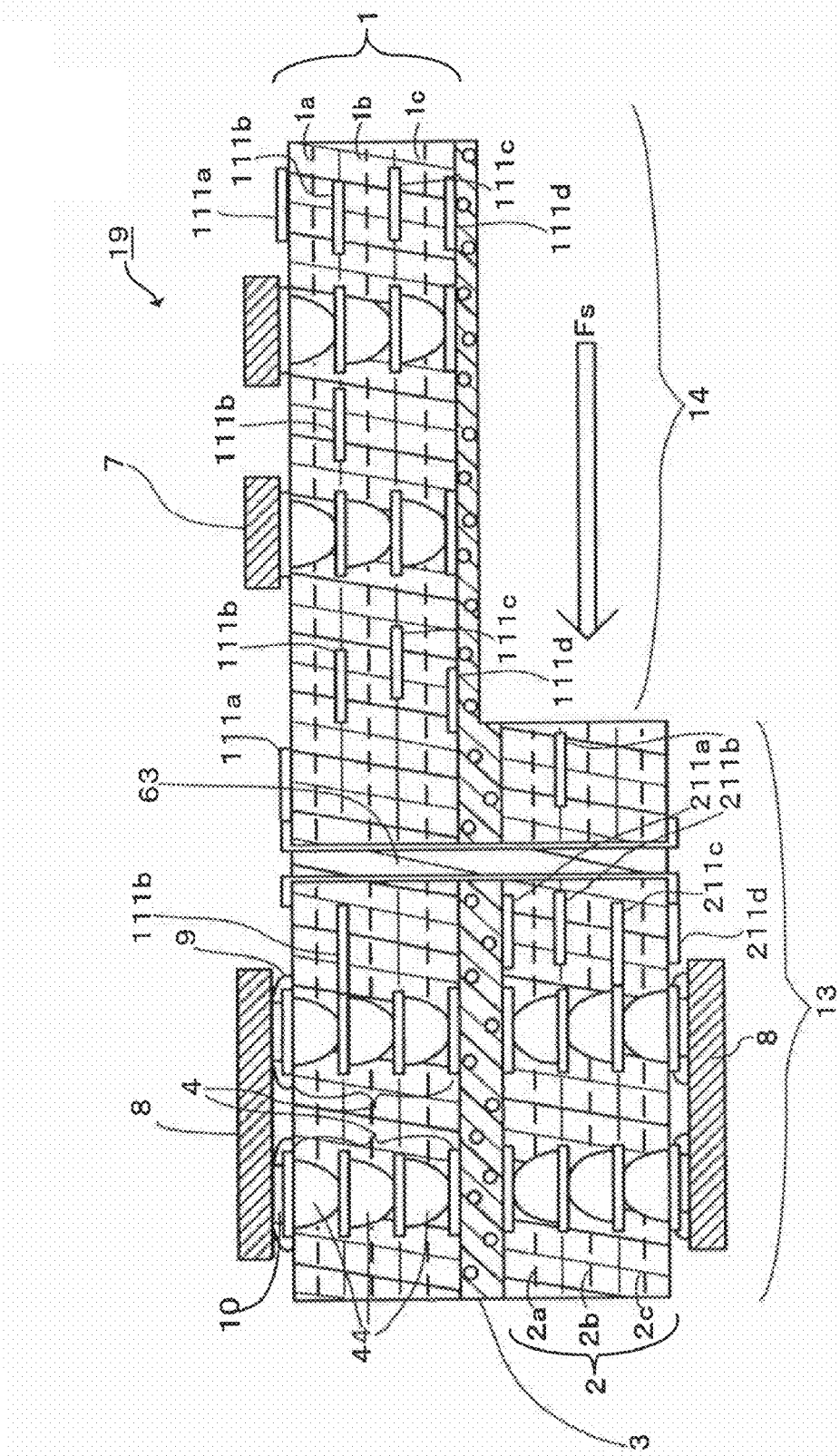
FIG. 14 is a cross-sectional view of a wiring board according to an embodiment of the present invention.
Figure 15:
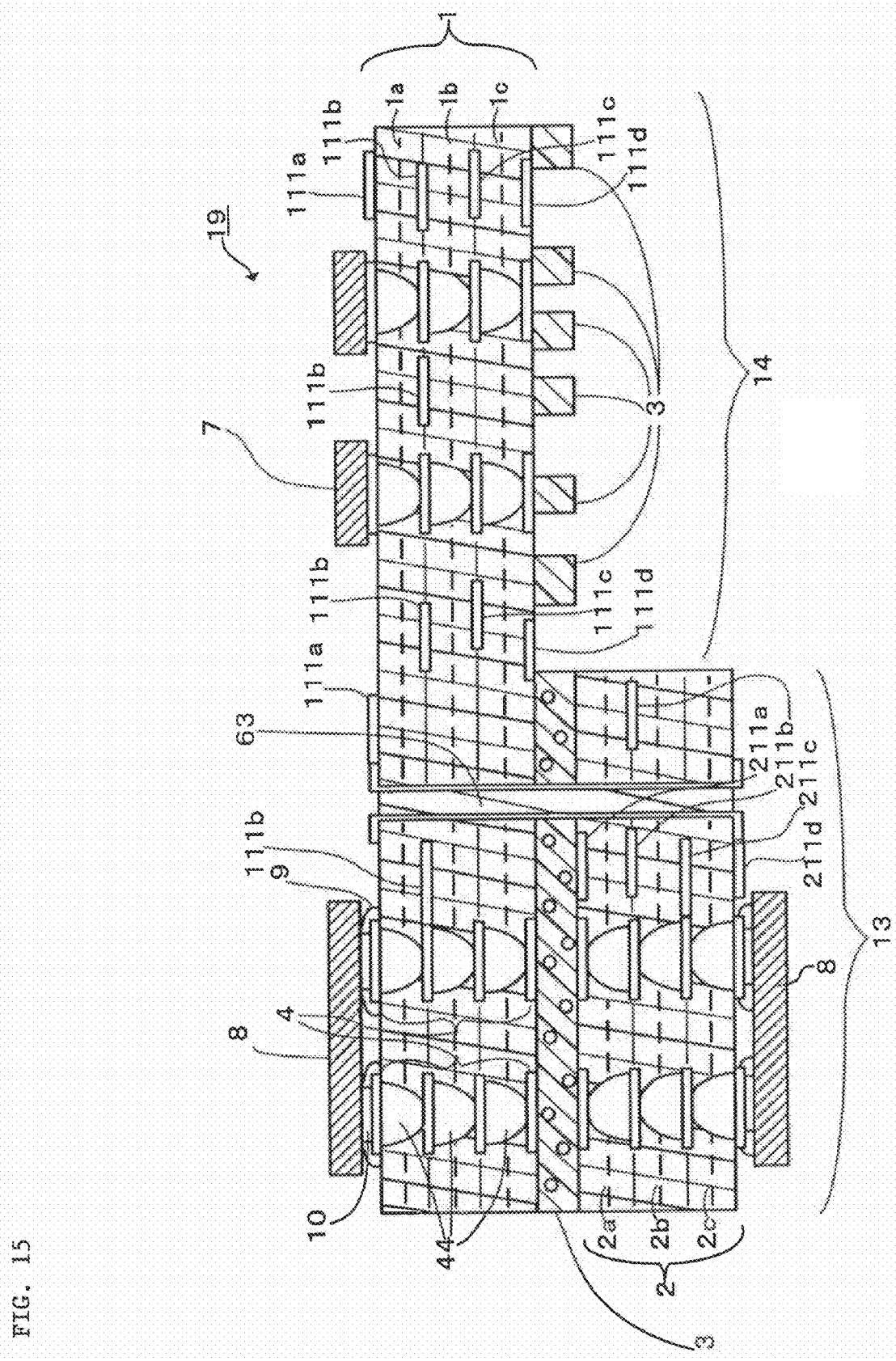
FIG. 15 is a cross-sectional view of a wiring board according to an embodiment of the present invention.

In the embodiment of FIG. 2, base substrate 3 was made of glass-epoxy resin and first substrate 1 and second substrate 2 were made of epoxy resin. However, a combination of the material for base substrate 3 and the material for first substrate 1 and second substrate 2 is not limited to such. As shown in FIGS. 14-15, base substrate 3 is formed with resin containing inorganic filler; and first substrate 1 and second substrate 2 are formed with base material of resin-impregnated inorganic fabric. Since at least either first substrate 1 or second substrate 2 is reinforced with inorganic fabric, tolerance to warping may be improved. Accordingly, when an electronic device such as a cell phone receives an impact from being dropped or the like, the risk of rupture in the wiring that connects electronic components mounted in the wiring board may be minimized.

The above-described inorganic material such as inorganic fabric or inorganic filler has a small coefficient of thermal-expansion and small elasticity compared with resin made of organic material. Accordingly, when inorganic material such as inorganic fabric or inorganic filler is combined, alignment gaps between connection lands may be reduced.

In the method of manufacturing a wiring board according to the embodiments of FIGS. 14-15, referring to FIG. 7A, as the material to form core 55, resin containing inorganic filler is used. In addition, for the resin to be laminated in reference to FIGS. 7C, 7F and 7I, a base material of resin-impregnated inorganic fabric is used. The rest is substantially the same as the method of manufacturing a wiring board according to FIGS. 7A-7P and FIG. 9.

As noted above, embodiments of the invention are not limited to one end of first substrate 1 and one end of second substrate 2 being aligned. As shown in FIG. 16A, one end of second substrate 2 may protrude from one end of first substrate 1, and one end of the first substrate 1 may protrude from the second substrate 2. Here, the protruding portions of the first and second substrates make up a periphery portion of the wiring board that is thinner than a center portion of the wiring board which includes the first substrate 1, second substrate 2 and base 3.

Also, as shown in FIG. 16B, opposite ends of first substrate 1 may protrude from ends of second substrate 2. Here, the protruding portions of only the first and second substrate make up a periphery portion of the wiring board that is thinner than a center portion of the wiring board which includes the first substrate 1, second substrate 2 and base 3.

In addition, in a wiring board according to the embodiment of FIG. 2, first substrate 1 and second substrate 2 have a layered structure having a rectangular outline. However, they are not limited to such, but may have a layered structure having a circular, hexagonal or octagonal outline.

Also, in the embodiment of FIG. 2, first substrate 1 and second substrate 2 are made of epoxy resin. However, first substrate 1 and second substrate 2 are not limited to such, but may be made of polyimide, polycarbonate, polybutylene-telephtarate or polyacrylate. In addition, if first substrate 1 and second substrate 2 are made of epoxy resin, naphthalene-type epoxy resin, dicyclo-penta-diene-type epoxy resin, biphenyle-type epoxy resin or bisphenole-type epoxy resin may also be used.

In the embodiment of FIG. 2, as for solder 9, Sn/Ag/Cu was used. However, solder 9 is not limited to such; solder containing antimony, tin, lead, indium or copper may be used. Also, eutectic crystal metals such as Sn/Sb, Sn/Ag, Sn/Pb or Sb/Cu may be used as well. Among such eutectic crystal metals, to avoid having a bad influence on the substrates, using those having relatively low melting temperatures, 250° C. or lower, is preferred.

In addition, first substrate 1 is not necessarily formed single-layered, but may be formed multi-layered. Namely, first substrate 1 may be structured with a lower-layer insulation layer and an upper-layer insulation layer. Here, a lower-layer insulation layer indicates the insulation layer formed close to base substrate 3; and an upper-layer insulation layer indicates an insulation layer formed on the outer surface of the wiring board. Furthermore, first substrate 1 may be structured with a lower-layer insulation layer, an upper-layer insulation layer and an intermediate insulation layer positioned in between. The intermediate insulation layer may be made multi-layered. In the embodiment of FIG. 2, the lower-layer insulation layer corresponds to epoxy-resin layer 1c, the intermediate insulation layer corresponds to epoxy-resin layer 1b and the upper-layer insulation layer corresponds to epoxy-resin layer 1a.

Also, the second substrate is not necessarily formed single-layered, but may be formed multi-layered. Second substrate 2 may also be structured with a lower-layer insulation layer and an upper-layer insulation layer. Furthermore, second substrate 2 may be structured with a lower-layer insulation layer, an upper-layer insulation layer and an intermediate insulation layer positioned in between. In the embodiment of FIG. 2, the lower-layer insulation layer corresponds to epoxy-resin layer 2a, the intermediate insulation layer corresponds to epoxy-resin layer 2b and the upper-layer insulation layer corresponds to epoxy-resin layer 2c. On top of the upper-layer insulation layer and on top of the lower-layer insulation layer, conductive patterns may be formed. And, those conductive patterns may be connected with each other through vias 44.

The present invention may be practiced in a wiring board which can mount electronic components, specifically, in a wiring board which can mount electronic components for compact electronic devices.

What is claimed is:

1. A wiring board comprising:
a first substrate;
a second substrate having a smaller mounting area than a mounting area of the first substrate;
a base substrate laminated between the first substrate and the second substrate such that the first substrate extends beyond an edge of the second substrate; and
at least one via formed in at least one of the first substrate or the second substrate,
wherein a thickness of a portion of the base substrate that is sandwiched between the first substrate and the second substrate is greater than a thickness of a portion of the base substrate that is not sandwiched between the first substrate and the second substrate, and said portion of the base substrate that is not sandwiched between the first substrate and the second substrate includes a surface which is in direct contact with the first substrate.

2. The wiring board according to claim 1, wherein said portion of the base substrate that is not sandwiched between the first substrate and second substrate comprises a plurality of portions formed intermittently.

3. The wiring board according to claim 1, wherein:
the base substrate comprises resin-impregnated inorganic fabric,
the first substrate comprises at least one of resin containing inorganic filler or pliable resin, and
the second substrate comprises at least one of resin containing inorganic filler or pliable resin.

4. The wiring board according to claim 3, wherein the resin-impregnated inorganic fabric comprises glass cloth.

5. The wiring board according to claim 3, wherein at least one of the first substrate or the second substrate comprises the inorganic filler, and the inorganic filler comprises at least one of silica filler or glass filler.

6. The wiring board according to claim 1, wherein:
the base substrate comprises resin containing inorganic filler, and
at least one of the first substrate or the second substrate comprises base material of resin-impregnated inorganic fabric.

7. The wiring board according to claim 6, wherein the resin-impregnated inorganic fabric comprises glass cloth.

8. The wiring board according to claim 6, wherein the resin containing inorganic filler comprises at least one of silica filler or glass filler.

9. The wiring board according to claim 1, further comprising:
a conductive pattern formed on the first substrate;
a conductive pattern formed on the second substrate, wherein the conductive pattern on the first substrate and the conductive pattern on the second substrate are connected by way of a through-hole which penetrates the base substrate and further penetrates the first substrate and second substrate.

10. The wiring board according to claim 1, further comprising a conductive layer formed on an inner surface of at least one of said vias by plating, wherein the at least one via is filled with metal.

11. The wiring board according to claim 1, further comprising a conductive layer formed on an inner surface of at least one of said vias by plating, wherein the at least one via is filled with resin.

12. The wiring board according to claim 1, wherein:
the first substrate is structured with a first lower-layer insulation layer and a first upper-layer insulation layer, and
the second substrate is structured with a second lower-layer insulation layer and a second upper-layer insulation layer.

13. The wiring board according to claim 12, further comprising:
conductive patterns formed on each of the upper-layer insulation layers;
conductive patterns formed on each of the lower-layer insulation layers, wherein the conductive patterns on the upper-layer insulation layers are each connected to a respective conductive pattern on the lower-layer insulation layers by way of vias.

14. The wiring board according to claim 1, wherein the second substrate comprises a plurality of layers and is connected at a first end of the first substrate to form a relatively thick portion of the wiring board at said first end, and a relatively thin portion of the wiring board at a second end of the first substrate where the second substrate is not connected.

* * * * *